US012809544B2

(12) United States Patent
Song et al.

(10) Patent No.: US 12,809,544 B2
(45) Date of Patent: Nov. 24, 2026

(54) SEMICONDUCTOR MEMORY DEVICE AND ERASE OPERATION METHOD THEREOF

(71) Applicant: IUCF-HYU (Industry-University Cooperation Foundation Hanyang University), Seoul (KR)

(72) Inventors: Yun-Heub Song, Seoul (KR); Seonjun Choi, Seoul (KR); Jae Min Sim, Seoul (KR)

(73) Assignee: IUCF-HYU (Industry-University Cooperation Foundation Hanyang University), Seoul (KR)

( * ) Notice: Subject to any disclaimer, the term of this patent is extended or adjusted under 35 U.S.C. 154(b) by 710 days.

(21) Appl. No.: 18/300,889

(22) Filed: Apr. 14, 2023

(65) Prior Publication Data

US 2024/0220148 A1 Jul. 4, 2024

(30) Foreign Application Priority Data

Dec. 29, 2022 (KR) ........................ 10-2022-0189423

(51) Int. Cl.

| | |
|---|---|
| ***G11C 16/04*** | (2006.01) |
| ***G06F 3/06*** | (2006.01) |
| ***H10B 43/27*** | (2023.01) |

(52) U.S. Cl.

CPC .......... *G06F 3/0652* (2013.01); *G06F 3/0604* (2013.01); *G06F 3/0679* (2013.01); *G11C 16/04* (2013.01); *H10B 43/27* (2023.02)

(58) Field of Classification Search

CPC .... G06F 3/0652; G06F 3/0604; G06F 3/0679; G11C 16/04; G11C 16/14;

(Continued)

(56) References Cited

U.S. PATENT DOCUMENTS

| | | | | |
|---|---|---|---|---|
| 9,711,229 B1 * | 7/2017 | Rabkin | .................. | H10B 43/10 |
| 9,754,673 B2 | 9/2017 | Park et al. | | |

(Continued)

FOREIGN PATENT DOCUMENTS

| | | |
|---|---|---|
| KR | 102057283 B1 | 12/2019 |
| KR | 10-2020-0112192 A | 10/2020 |

(Continued)

OTHER PUBLICATIONS

Y. Zhang, L. Jin, X. Zou, H. Liu, A. Zhang and Z. Huo, "A Novel Program Scheme for Program Disturbance Optimization in 3-D NAND Flash Memory," in IEEE Electron Device Letters, vol. 39, No. 7, pp. 959-962, Jul. 2018 (Year: 2018).*

(Continued)

*Primary Examiner* — Alexander Sofocleous
*Assistant Examiner* — James S. Wells
(74) *Attorney, Agent, or Firm* — Harness, Dickey & Pierce, P.L.C.

(57) ABSTRACT

Disclosed is an erase operation method of a semiconductor memory device which includes a cell string disposed between a bit line and a common source line and connected with a plurality of word lines. The operation method includes precharging a channel of the cell string by applying a ground voltage to the bit line and applying a pass voltage to the word lines, and generating a gate induced drain current (GIDL) current by applying an erase voltage to the bit line and the pass voltage to the word lines, and the pass voltage is greater than the ground voltage, and the erase voltage is greater than the pass voltage.

9 Claims, 31 Drawing Sheets

(58) Field of Classification Search
CPC .... G11C 16/0483; G11C 16/08; H10B 43/27; H10B 51/20; H10B 51/30; H10D 64/689
See application file for complete search history.

(56) References Cited

U.S. PATENT DOCUMENTS

| | | | | |
|---|---|---|---|---|
| 10,068,651 | B1 * | 9/2018 | Diep | G11C 16/344 |
| 11,367,487 | B2 | 6/2022 | Park et al. | |
| 11,482,277 | B2 | 10/2022 | Kim et al. | |
| 11,515,333 | B2 | 11/2022 | Song et al. | |
| 11,545,222 | B2 | 1/2023 | Lee | |
| 2013/0083601 | A1 | 4/2013 | Liu et al. | |
| 2014/0112075 | A1 * | 4/2014 | Dunga | G11C 16/10 365/185.17 |
| 2015/0170749 | A1 | 6/2015 | Park et al. | |
| 2015/0348637 | A1 | 12/2015 | Han et al. | |
| 2021/0375890 | A1 | 12/2021 | Chia | |
| 2022/0076756 | A1 * | 3/2022 | Lee | G11C 16/14 |
| 2023/0019540 | A1 | 1/2023 | Song et al. | |
| 2025/0348637 | A1 * | 11/2025 | Zhu | G06F 30/20 |

FOREIGN PATENT DOCUMENTS

| | | | |
|---|---|---|---|
| KR | 10-2021-0012648 | A | 2/2021 |
| KR | 10-2021-0152378 | A | 12/2021 |
| KR | 10-2022-0031464 | A | 3/2022 |
| KR | 10-2022-0057049 | A | 5/2022 |
| KR | 10-2022-0060381 | A | 5/2022 |

OTHER PUBLICATIONS

Yang, Tao; Zhang, Bao; Wang, Qi; Jin, Lei; Xia, Zhiliang, "Self-Adaption of the GIDL Erase Promotes Stacking More Layers in 3D NAND Flash" Micromachines (Basel), Mar. 2023, vol. 14 (3), p. 686.*

Seonjun Choi et al., "Innovative structure to improve erase speed in 3D NAND flash memory with Cell-On-Peri (COP) applied" IEEE Transactions on Electron Devices, vol. 69, No. 9, 2022.

* cited by examiner

SEMICONDUCTOR MEMORY DEVICE AND ERASE OPERATION METHOD THEREOF

CROSS-REFERENCE TO RELATED APPLICATIONS

This application claims priority under 35 U.S.C. § 119 to Korean Patent Application No. 10-2022-0189423 filed on Dec. 29, 2022, in the Korean Intellectual Property Office, the disclosures of which are incorporated by reference herein in their entireties.

BACKGROUND

Embodiments of the present disclosure described herein relate to a semiconductor memory device and an erase method of the semiconductor memory device.

An electronic system that needs to store data may require a semiconductor device capable of storing a large amount of data. As such, a way to increase a data storage capacity of the semiconductor device is being developed. For example, as one of the methods for increasing the data storage capacity of the semiconductor device, there is being developed a semiconductor device including memory cells arranged in a three-dimensional structure instead of memory cells arranged in a two-dimensional structure.

SUMMARY

Embodiments of the present disclosure provide an erase operation method of a low-power, high-speed semiconductor memory device.

Embodiments of the present disclosure provide a low-power, high-speed semiconductor memory device.

Embodiments of the present disclosure provide an electronic system including a semiconductor memory device.

According to an embodiment, an erase operation method of a semiconductor memory device which includes a cell string disposed between a bit line and a common source line and connected with a plurality of word lines includes precharging a channel of the cell string by applying a ground voltage to the bit line and applying a pass voltage to the word lines, and generating a gate inducted drain leakage (GIDL) current by applying an erase voltage to the bit line and the pass voltage to the word lines, and the pass voltage is greater than the ground voltage, and the erase voltage is greater than the pass voltage.

According to an embodiment, a semiconductor memory device includes a stack structure that includes gate electrodes and insulating layers disposed on a substrate so as to be stacked alternately, a vertical structure that penetrates the stack structure, and a bit line and a filler control line that is disposed on the vertical structure. The vertical structure includes a vertical conductive filler, a vertical channel layer surrounding the vertical conductive filler, and a ferroelectric layer surrounding the vertical channel layer. The bit line is connected with the vertical channel layer, and the filler control line is connected with the vertical conductive filler.

According to an embodiment, a semiconductor memory device includes a substrate including a first conductive substrate, a stack structure including gate electrodes and insulating layers disposed on the substrate so as to be stacked alternately, a vertical structure penetrating the stack structure, and a bit line disposed on the vertical structure. The vertical structure includes a vertical conductive filler, a vertical channel layer surrounding the vertical conductive filler, and a ferroelectric layer surrounding the vertical channel layer. The bit line is connected with the vertical channel layer, and the first conductive substrate is connected with the vertical conductive filler.

BRIEF DESCRIPTION OF THE FIGURES

The above and other objects and features of the present disclosure will become apparent by describing in detail embodiments thereof with reference to the accompanying drawings.

DETAILED DESCRIPTION

Below, embodiments of the present disclosure will be described in detail and clearly to such an extent that an ordinary one in the art easily implements the invention.

Figure 1:
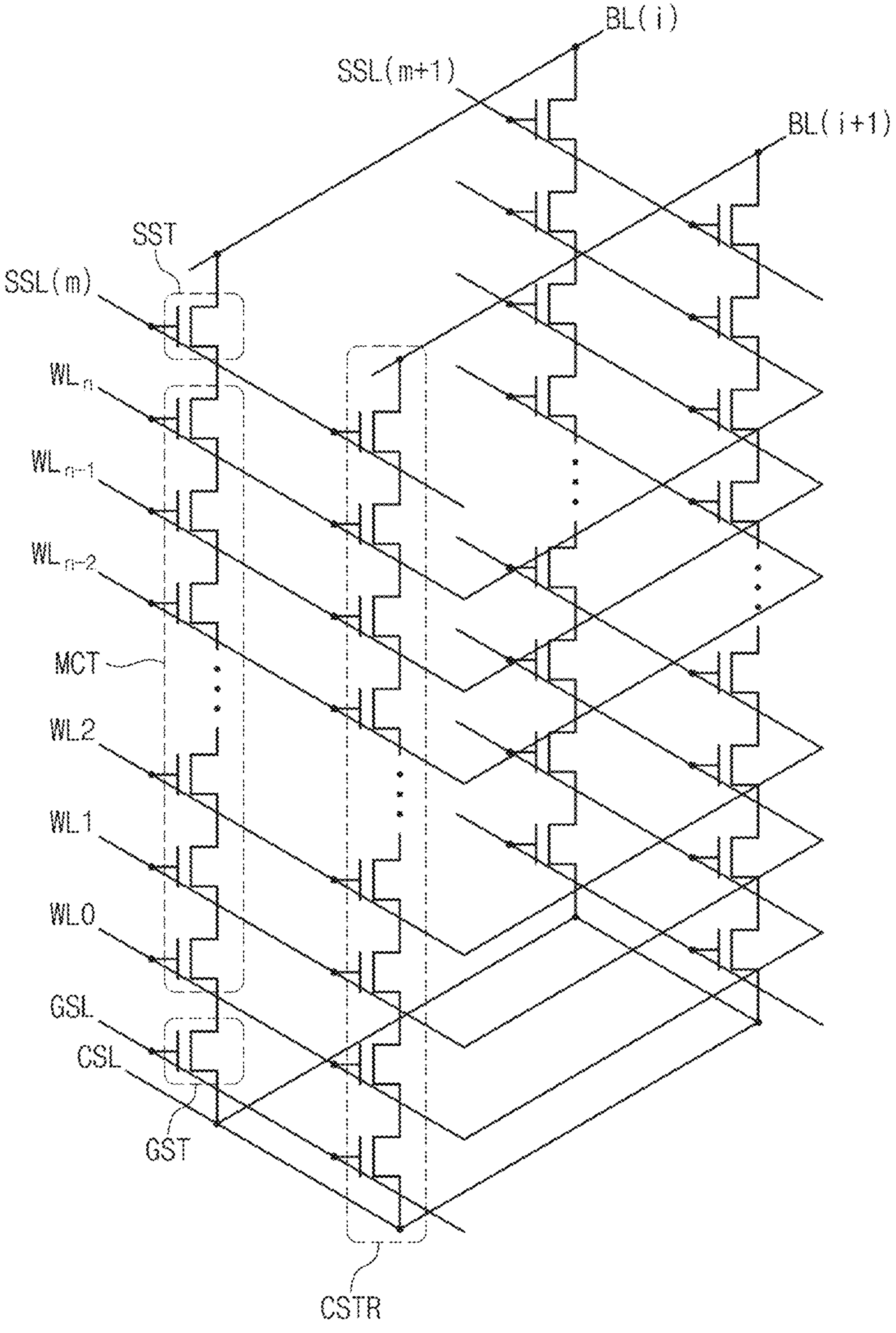
FIG. 1 is a circuit diagram illustrating a cell array of a conventional semiconductor memory device for describing the present disclosure.

FIG. 1 is a circuit diagram illustrating a cell array of a conventional semiconductor memory device for describing the present disclosure.

Referring to FIG. 1, a cell array of a semiconductor memory device may include bit lines BL(i) and BL(i+1), a common source line CSL, word lines WL0 to WLn, string selection lines SSL(m) and SSL(m+1), ground selection lines GSL, and cell strings CSTR between the bit lines BL(i) and BL(i+1) and the common source line CSL.

The bit lines BL(i) and BL(i+1) may be arranged in a two-dimensional structure, and a plurality of cell strings CSTR may be connected in parallel with each of the bit lines BL(i) and BL(i+1). The cell strings CSTR may be connected in common with the common source line CSL. That is, the plurality of cell strings CSTR may be disposed between the plurality of bit lines BL(i) and BL(i+1) and one common source line CSL.

Each of the cell strings CSTR may include a ground selection transistor GST connected with the common source line CSL, a string selection transistor SST connected with the bit line BL(i)/BL(i+1), and a plurality of memory cells MCT disposed between the ground selection transistor GST and the string selection transistor SST. The ground selection transistor GST, the string selection transistor SST, and the memory cells MCT may be connected in series. Each of the cell strings CSTR may include one or plural string selection transistors SST and one or plural ground selection transistors GST.

A ground selection line GSL may be used as a gate electrode of the ground selection transistor GST, a plurality of word lines WL may be used as gate electrodes of the memory cells MCT, and string selection lines SSL may be used as gate electrodes of the string selection transistors SST.

The string selection lines SSL may control the electrical connection between the bit lines BL(i) and BL(i+1) and the cell strings CSTR, and the ground selection line GSL may control the electrical connection between the cell strings CSTR and the common source line CSL. The plurality of word lines WL may control the memory cells MCT. In the plurality of cell strings CSTR, the memory cells MCT located at the same level may be connected with the same word line WL.

One of the plurality of cell strings CSTR may be selected by one selected from the bit lines BL(i) and BL(i+1) and one selected from the string selection lines SSL(m) and SSL(m+1). Also, in the selected cell string CSTR, one of the memory cells MCT may be selected by one selected from the word lines WL0 to WLn.

Each of the memory cells MCT may include an information storage element having a ferroelectric material. Data may be stored or erased in or from each memory cell MCT by using a polarization change of a dipole in the information storage element, which is caused by voltages input to the word lines WL0 to WLn. As the semiconductor memory device uses the information storage element having a ferroelectric material, the semiconductor memory device may operate with a relatively low power and may implement a fast operating speed.

Figure 2:
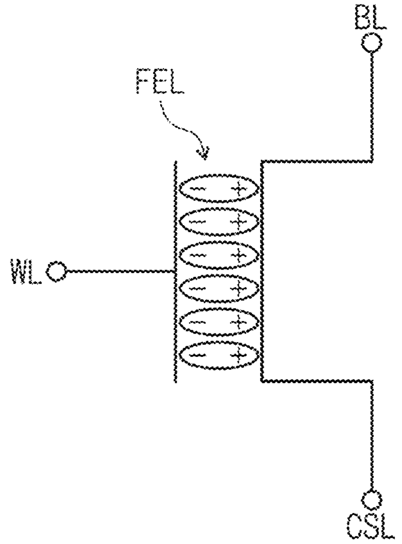
FIG. 2 is a circuit diagram illustrating a unit memory cell of FIG. 1.

FIG. 2 is a circuit diagram illustrating a unit memory cell of FIG. 1.

Referring to FIG. 2, each memory cell MCT may be controlled by the word line WL and the bit line BL. Each memory cell MCT may include a gate electrode, a source electrode, a drain electrode, and a channel between the source electrode and the drain electrode. The gate electrode of each memory cell MCT may be connected with the word line WL. The bit line BL may be connected with the drain electrode, and the common source line CSL may be connected with the source electrode. Each memory cell MCT may include a ferroelectric layer FEL as a memory layer (or a data storage layer) between the channel region and the gate electrode.

The ferroelectric layer FEL may include a ferroelectric material having a polarization characteristic by the electric field applied thereto. The ferroelectric material may be made of a dielectric material including hafnium. The ferroelectric layer FEL may include, for example, at least one of $HfO_2$, $HfSiO_2$ (Si-doped $HfO_2$), $HfAlO_2$ (Al-doped $HfO_2$), HfSiON, HfZnO, HfZr02, $ZrO_2$, $ZrSiO_2$, $HfZrSiO_2$, ZrSiON, LaAlO, $HfDyO_2$, and $HfScO_2$.

The ferroelectric layer FEL may have a spontaneous dipole (or electric dipole), that is, a spontaneous polarization through the non-centrosymmetric charge distribution in each memory cell MCT. The ferroelectric layer FEL has a remnant polarization by a dipole even in a state where there is no external electric field. The direction of polarization may be switched by the external electric field.

In other words, the ferroelectric layer FEL may have a positive or negative polarization state; the polarization state may change due to the electric field applied to the ferroelectric layer FEL during the program operation. The polarization state of the ferroelectric layer FEL may be maintained even though the power is turned off, and thus, the semiconductor memory device may operate as a nonvolatile memory device. The polarization state of the ferroelectric layer FEL may be determined by a voltage difference of the channel region and the gate electrode.

As an example, in the program operation, the channel region of the memory cell MCT may be depleted by a first program voltage applied to the gate electrode of the memory cell MCT, and the polarity of the ferroelectric layer FEL may be changed by the difference between the first program voltage and a voltage of the channel region. The difference between the first program voltage and a voltage of the channel region may be a minimum voltage necessary to change the polarization of the ferroelectric layer FEL.

In the operation of reading data from the memory cell MCT, the data stored in the memory cell MCT may be read by measuring a current flowing through the channel region of the selected memory cell MCT.

In the operation of erasing data programmed in the memory cell MCT, the plurality of memory cells MCT may be simultaneously or selectively erased by increasing the voltage of the channel region. How to erase the memory cells MCT will be described in detail with reference to FIGS. 8 to 11.

Figure 3:
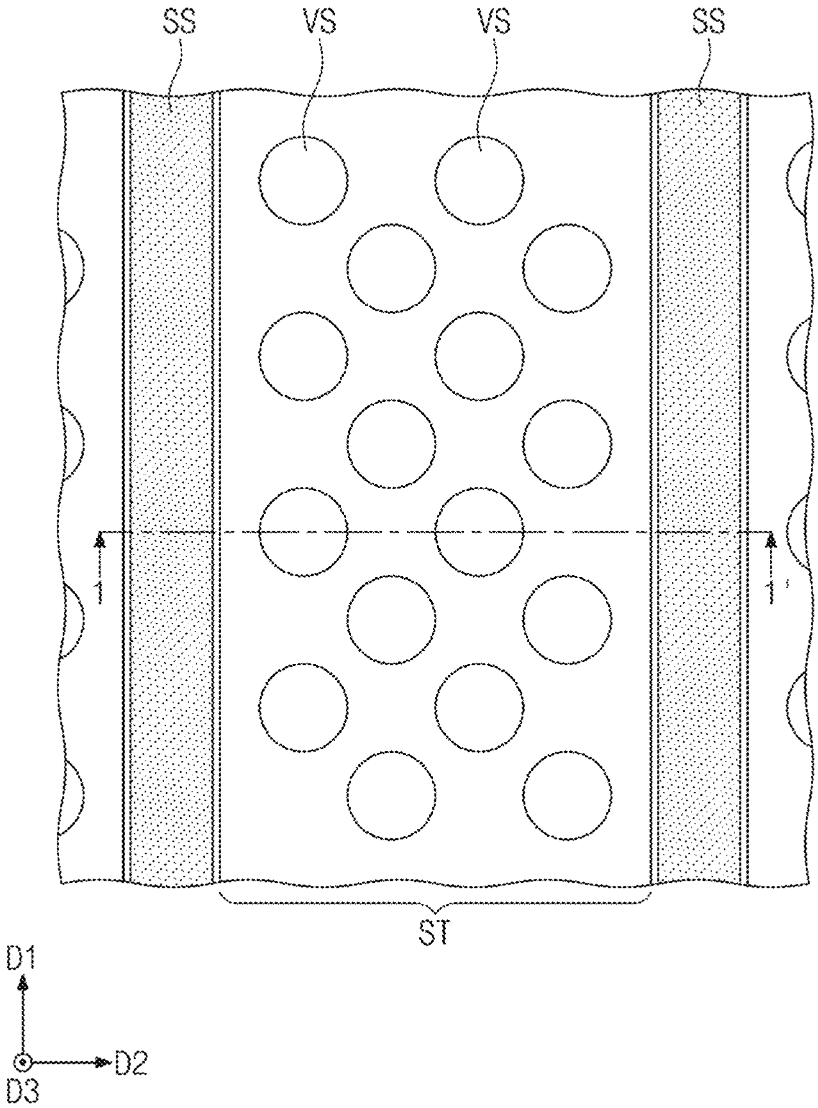
FIG. 3 is a plan view of a cell array of a semiconductor memory device of FIG. 1.
Figure 4:
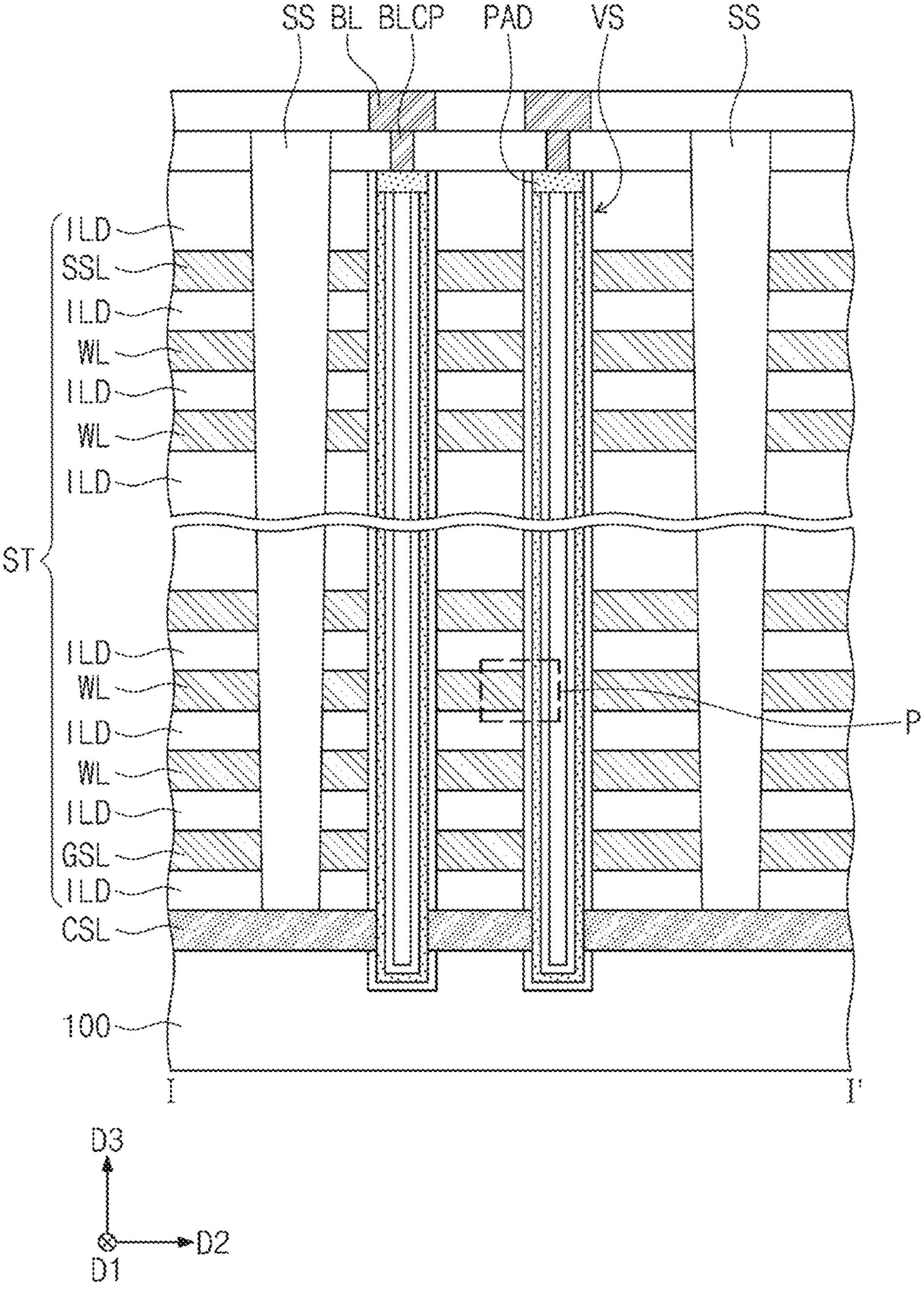
FIG. 4 is a cross-sectional view of a cell array taken along line I-I' of FIG. 3.
Figure 5:
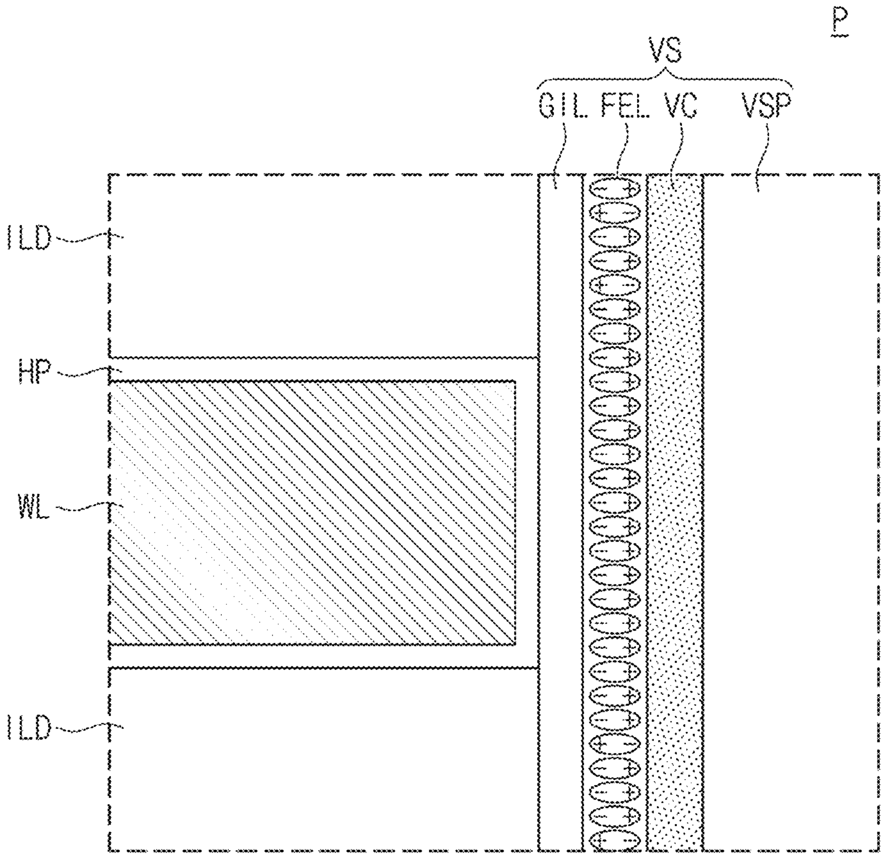
FIGS. 5, 6, and 7 are enlarged views of portion "P" of FIG. 4.
Figure 6:
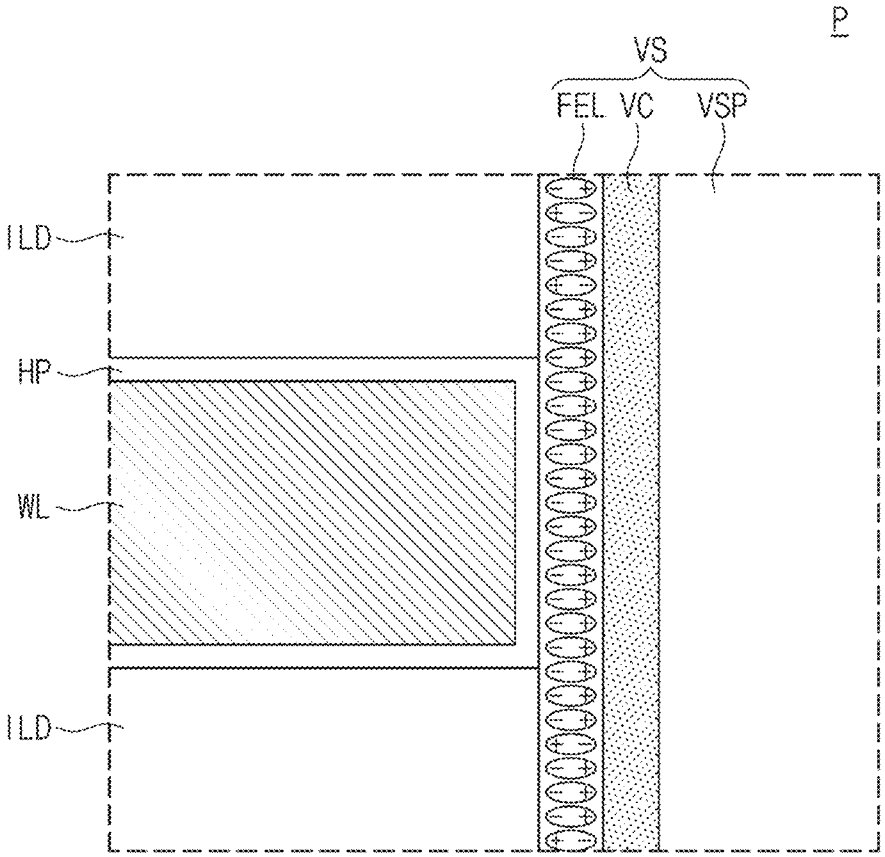
Figure 7:
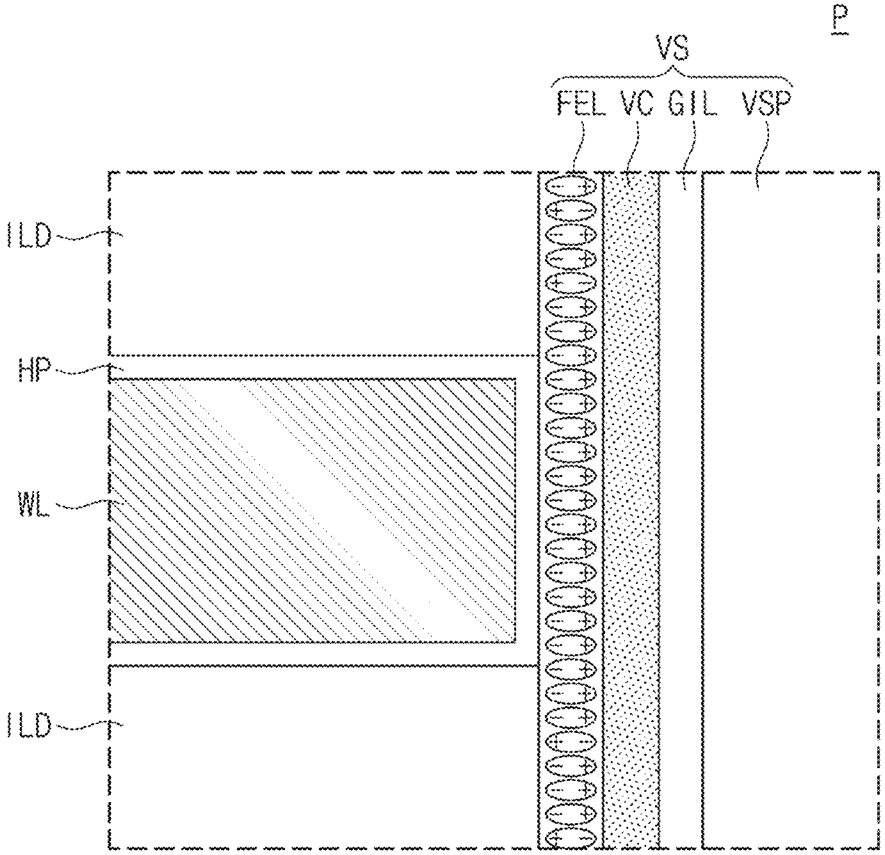

FIG. 3 is a plan view of a cell array of a semiconductor memory device of FIG. 1, and FIG. 4 is a cross-sectional view of a cell array taken along line I-I' of FIG. 3. FIGS. 5, 6, and 7 are enlarged views of portion "P" of FIG. 4.

Referring to FIGS. 3 and 4, a semiconductor memory device according to embodiments may include a stack structure ST, vertical structures VS, and bit lines BL on a substrate 100. According to embodiments, the cell strings CSTR (refer to FIG. 1) may be integrated on the substrate 100, and the stack structure ST and the vertical structures VS may constitute the cell strings CSTR, The substrate 100 may be formed of a semiconductor material, an insulating material, or a conductive material. The substrate 100 may include a semiconductor that is doped with dopants of a first conductivity type (e.g., n-type) or an intrinsic semiconductor that is not doped with impurities. The substrate 100 may have a crystalline structure including at least one selected from a group of single crystalline, amorphous, and polycrystalline.

The stack structure ST may be disposed on the substrate 100 and may extend along a first direction D1. The stack structure ST may include gate electrodes SSL, WL, and GSL and insulating layers ILD that are alternately stacked along a third direction D3 (i.e., a vertical direction) perpendicular to first and second directions D1 and D2 crossing each other.

The gate electrodes SSL, WL, and GSL may include, for example, at least one selected from a group of doped semiconductor (e.g., doped silicon, etc.), metal (e.g., tungsten, copper, or aluminum), conductive metal nitride (e.g., titanium nitride or tantalum nitride) or transition metal (e.g., titanium or tantalum). The insulating layers ILD may include a silicon oxide layer and/or a low dielectric layer. According to embodiments, the semiconductor device may be a vertical NAND flash memory device; in this case, the electrodes SSL, WL, and GSL of the stack structure ST may be used as the string selection lines SSL, the word lines WL, and the ground selection lines GSL described with reference to FIG. 1.

The common source line CSL may be disposed between the substrate 100 and the stack structure ST. The common source line CSL may extend in the first direction D1 to be parallel to the stack structure ST. The common source line CSL may include a semiconductor material and a conductive material.

The plurality of vertical structures VS may penetrate the stack structure ST. Referring to FIG. 4, the plurality of vertical structures VS may extend in the third direction D3 perpendicular to the upper surface of the substrate 100. The vertical structure VS may penetrate the conductive materials forming the ground selection line GSL, the string selection lines SSL, and the word lines WL. In other words, the ground selection line GSL, the string selection lines SSL, and the word lines WL may surround the vertical structure VS. The word lines WL may include a dummy word line that is not used to store data. The dummy word line may be used for various purposes. The memory cells MCT may be respectively provided between the vertical structures VS and the gate electrodes WL.

Separation structures SS may penetrate the stack structure ST on the substrate 100. Each of the separation structures SS may include an insulating layer covering a sidewall of the stack structure ST. Each of the separation structures SS may have a single-layer or multi-layer structure.

The separation structures SS may extend along the first direction D1 to be parallel to the stack structure ST and may be spaced from each other in the second direction D2 intersecting the first direction D1. The stack structure ST may be disposed between the separation structures SS adjacent to each other. The separation structures SS may be disposed on the substrate 100 or the common source line CSL. The upper surfaces of the separation structures SS may be located at substantially the same level and may be located at a higher level than the upper surfaces of the vertical structures VS.

The bit lines BL are omitted in the plan view of FIG. 3, but the bit lines BL may extend in the first direction D1 or the second direction D2 across the stack structure ST. The bit lines BL may be connected with vertical channel layers VC of the vertical structures VS through bit line contact plugs BLCP.

In a plan view, the vertical structures VS may be arranged along one direction or may be arranged in the shape of zigzag. As a distance from the substrate 100 increases, the width or diameter of the vertical structure VS may increase. In other words, the vertical structure VS may have a sidewall inclined with respect to the upper surface of the substrate 100.

In detail, referring to FIG. 5, each of the vertical structures VS may include a vertical semiconductor pattern VSP, the ferroelectric layer FEL between the gate electrode WL and the vertical semiconductor pattern VSP, a gate insulating layer GIL between the ferroelectric layer FEL and the gate electrode WL, and the vertical channel layer VC between the vertical semiconductor pattern VSP and the ferroelectric layer FEL. In other words, each of the vertical structures VS may include the gate insulating layer GIL, the ferroelectric layer FEL, the vertical channel layer VC, and the vertical semiconductor pattern VSP that are sequentially disposed inwards from the outer wall.

The vertical semiconductor pattern VSP may be in the shape of a pillar extending in the third direction D3. Unlike the above example, the vertical semiconductor pattern VSP may have a U-shaped cross section, and the inside of the vertical semiconductor pattern VSP may be filled with an insulating material. The vertical semiconductor pattern VSP may be spaced from the substrate 100, and a portion of the ferroelectric layer FEL may be located between the vertical semiconductor pattern VSP and the substrate 100.

The vertical semiconductor pattern VSP may include a material that helps diffusion of charges or holes in a vertical channel pattern VCP. In detail, the vertical semiconductor pattern VSP may be formed of a material whose charge and hole mobility is excellent. For example, the vertical semiconductor pattern VSP may include one of a semiconductor material doped with impurities, an intrinsic semiconductor material not doped with impurities, and a polycrystalline semiconductor material. In detail, the vertical semiconductor pattern VSP may include polysilicon doped with dopants of the second conductivity type (e.g., p-type dopants) that is identical to that of the substrate 100.

The vertical channel layer VC may surround the sidewall of the vertical semiconductor pattern VSP and may extend in the third direction D3. The vertical channel layer VC may have a uniform thickness on the sidewall of the vertical semiconductor pattern VSP. The vertical channel layer VC may be used as channels of the select transistors SST and GST and the memory cells MCT described with reference to FIG. 1.

The vertical channel layer VC may include a semiconductor material such as silicon (Si), germanium (Ge), or a mixture thereof. The vertical channel layer VC may be in the shape of a pipe with a closed bottom or in the shape of a macaroni. The vertical channel layer VC may have a U-shape. For example, a portion of the sidewall of the vertical channel layer VC may contact the common source line CSL.

The ferroelectric layer FEL as a data storage layer may surround the outer wall of the vertical channel layer VC and may extend in the third direction D3. The ferroelectric layer FEL may have a uniform thickness on the outer wall of the vertical channel layer VC. The ferroelectric layer FEL may be in the shape of a pipe with a closed bottom or in the shape of a macaroni. The ferroelectric layer FEL may have a U-shape. An example in which the ferroelectric layer FEL is composed of a single layer is illustrated. As another example, the ferroelectric layer FEL may include a plurality of ferroelectric layers FEL.

The gate insulating layer GIL may surround the outer wall of the ferroelectric layer FEL and may extend in the third direction D3. The gate insulating layer GIL may have a uniform thickness on the ferroelectric layer FEL. The gate insulating layer GIL may be formed of an insulating material different from that of the ferroelectric layer FEL or may be formed of a non-ferroelectric material. For example, the gate insulating layer GIL may surround the sidewall of the ferroelectric layer FEL on the upper surface of the common source line CSL.

The gate insulating layers GIL may include, for example, a single layer selected from a high-k dielectric layer, a silicon oxide layer, a silicon nitride layer, and a silicon oxynitride layer, or a combination thereof. For example, the high-k film may include at least one of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

Returning to FIG. 4, a conductive pad PAD may be provided on the upper surfaces of the vertical channel layer VC and the vertical semiconductor pattern VSP. The conductive pad PAD may be connected with an upper portion of the vertical channel layer VC and an upper portion of the vertical semiconductor pattern VSP. The upper surface of the conductive pad PAD may be substantially coplanar with the upper surface of each of the stack structures ST (e.g., the upper surface of the uppermost insulating layers ILD among the insulating layers ILD).

A horizontal insulating pattern HP conformally covers one sidewall of the gate electrode (e.g., SSL, WL, or GSL), which is adjacent to the vertical structure VS, and the upper and lower surfaces of the gate electrode (e.g., SSL, WL, or GSL). The horizontal insulating pattern HP may include a high-k dielectric layer such as an aluminum oxide layer and a hafnium oxide layer.

Referring to FIG. 6 showing one comparative example, the gate insulating layer GIL may be omitted from the vertical structure VS, and the horizontal insulating pattern HP may directly contact the ferroelectric layer FEL.

Referring to FIG. 7 showing another comparative example, in the vertical structure VS, the gate insulating layer GIL may be disposed between the vertical semiconductor pattern VSP and the vertical channel layer VC.

Figure 8:
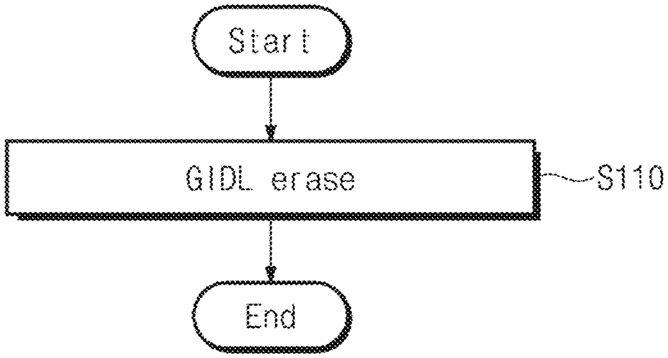
FIG. 8 is a flowchart illustrating an example of an erase operation method of a conventional semiconductor memory device for describing the present disclosure.
Figure 9:
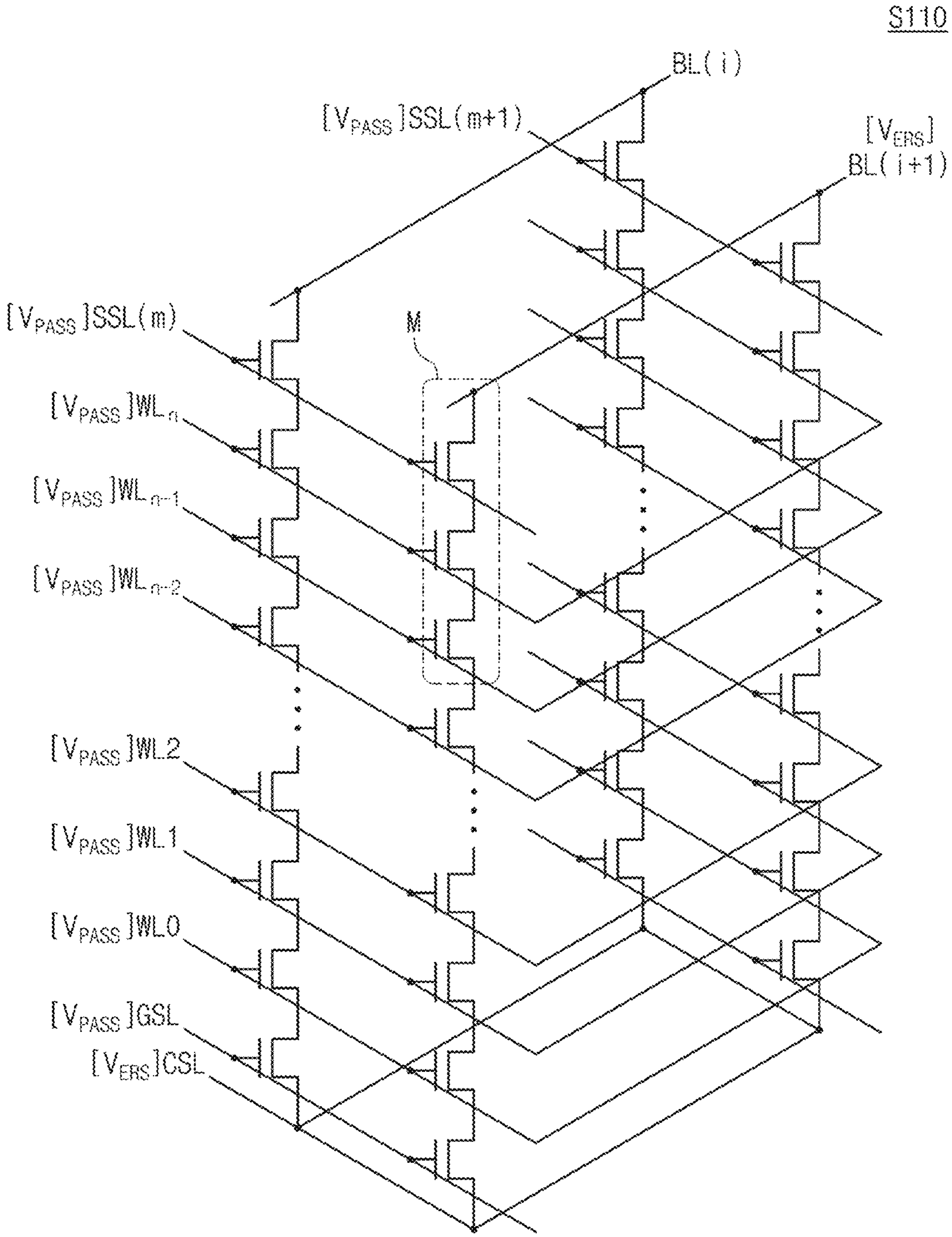
FIG. 9 is a circuit diagram illustrating a voltage condition in operation S110 of FIG. 8.
Figure 10:
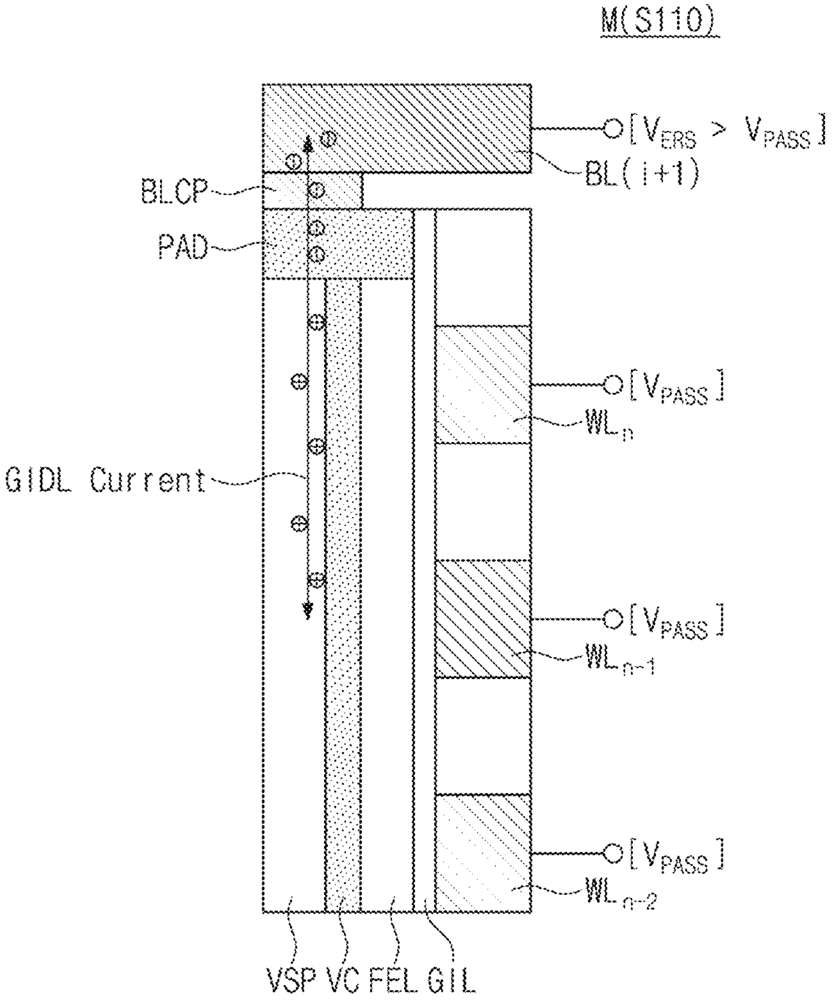
FIG. 10 is a diagram illustrating a portion of a semiconductor memory device corresponding to region "M" of FIG. 9.
Figure 11:
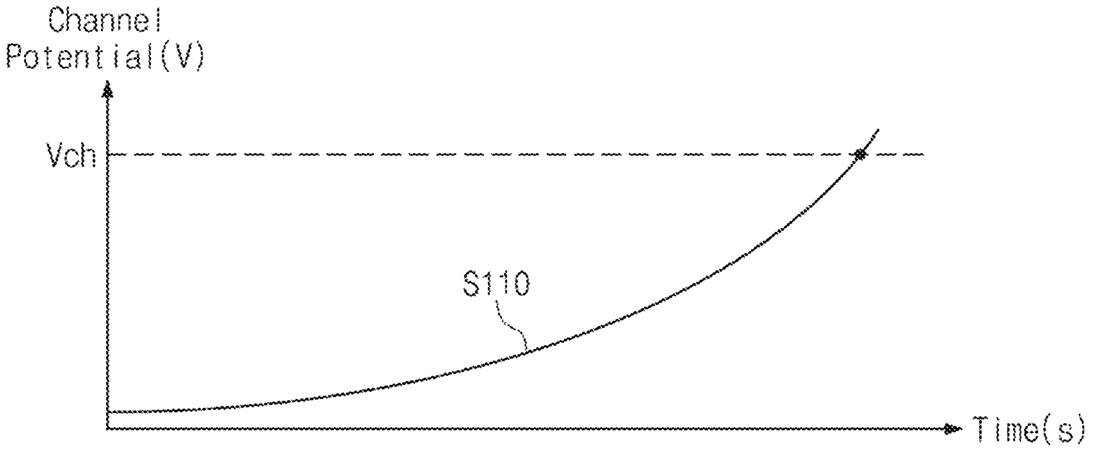
FIG. 11 is a graph illustrating how a voltage of the vertical channel layer VC increases in an erase operation.

FIG. 8 is a flowchart illustrating an example of an erase operation method of a conventional semiconductor memory device for describing the present disclosure. FIG. 9 is a circuit diagram illustrating a voltage condition in operation S110 of FIG. 8. FIG. 10 is a diagram illustrating a portion of a semiconductor memory device corresponding to region "M" of FIG. 9. FIG. 11 is a graph illustrating how a voltage of the vertical channel layer VC increases in an erase operation.

Referring to FIG. 8, an erase operation method of a conventional semiconductor memory device may include a GIDL erase step of generating a gate induced drain leakage current (hereinafter referred to as a "GIDL current") (operation 110). In each memory cell, the GIDL current may be generated by a difference between a gate voltage applied to the gate electrode and a drain voltage applied to the drain. For example, when the gate voltage is smaller than the drain voltage, the GIDL current may be generated by the band-to-band tunneling (BTBT). Below, how the GIDL current is generated will be described in detail.

Referring to FIGS. 9 and 10, in operation S110, an erase voltage $V_{ERS}$ may be applied to the bit lines BL(i) and BL(i+1) and the common source line CSL connected with cell strings of each memory block, and a pass voltage $V_{PASS}$ may be applied to the string selection line SSL, the word lines WL, and the ground selection line GSL. The erase operation for memory cells may be performed in units of memory block.

When the erase voltage $V_{ERS}$ is greater than the pass voltage $V_{PASS}$, a depletion region of the drain of each memory cell on the vertical channel layer VC may become smaller. When the depletion region of the drain decreases, a hole-electron pair may be generated. A hole and an electron may be separated from the hole-electron pair. The separated electron may be discharged to the outside (e.g., the bit line BL) of the memory cell through the bit line contact plug BLCP. As the separated hole is introduced into the vertical semiconductor pattern VSP, the GIDL current may be generated. A voltage of the vertical semiconductor pattern VSP may be formed by the holes introduced into the vertical semiconductor pattern VSP. As the amount/number of holes introduced into the vertical semiconductor pattern VSP increases, the voltage of the vertical semiconductor pattern VSP may increase.

As the voltage of the vertical semiconductor pattern VSP increases, the voltage of the vertical channel layer VC may also increase.

Referring to FIG. 11, the voltage of the vertical semiconductor pattern VSP may gradually increase by the GIDL current, and the voltage of the vertical channel layer VC may also gradually increase. When the voltage of the vertical channel layer VC reaches a reference voltage Vch (e.g., when the voltage of the vertical channel layer VC is greater than the pass voltage $V_{PASS}$), the erase operation for the memory cell may be performed.

The erase operation method according to an embodiment of the present disclosure is directed to decrease a time taken to increase the voltage of the vertical channel layer VC to the reference voltage Vch when the erase operation of the above semiconductor memory device is performed.

Below, a semiconductor memory device and an erase operation method of the semiconductor memory device according to embodiments of the present disclosure will be described in detail with reference to the conventional semiconductor memory device and the erase operation described in FIGS. 1 to 11.

Figure 12:
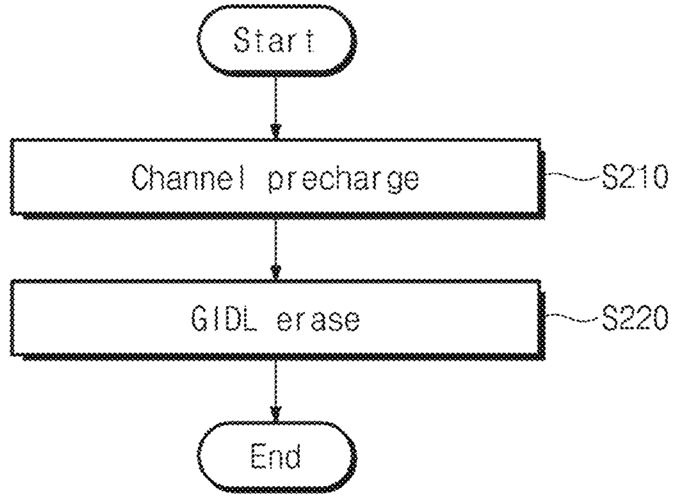
FIG. 12 is a flowchart illustrating an erase operation method of a semiconductor memory device according to an embodiment of the present disclosure.
Figure 13:
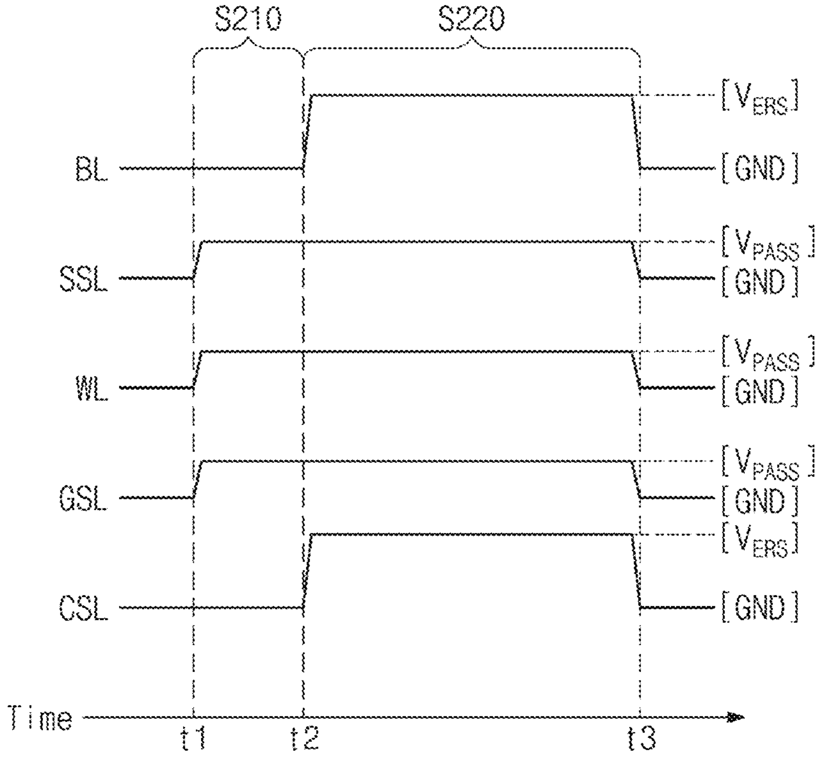
FIG. 13 is a timing diagram for describing an erase operation of FIG. 12.

FIG. 12 is a flowchart illustrating an erase operation method of a semiconductor memory device according to an embodiment of the present disclosure. FIG. 13 is a timing diagram for describing an erase operation of FIG. 12, FIG.

Figure 16:
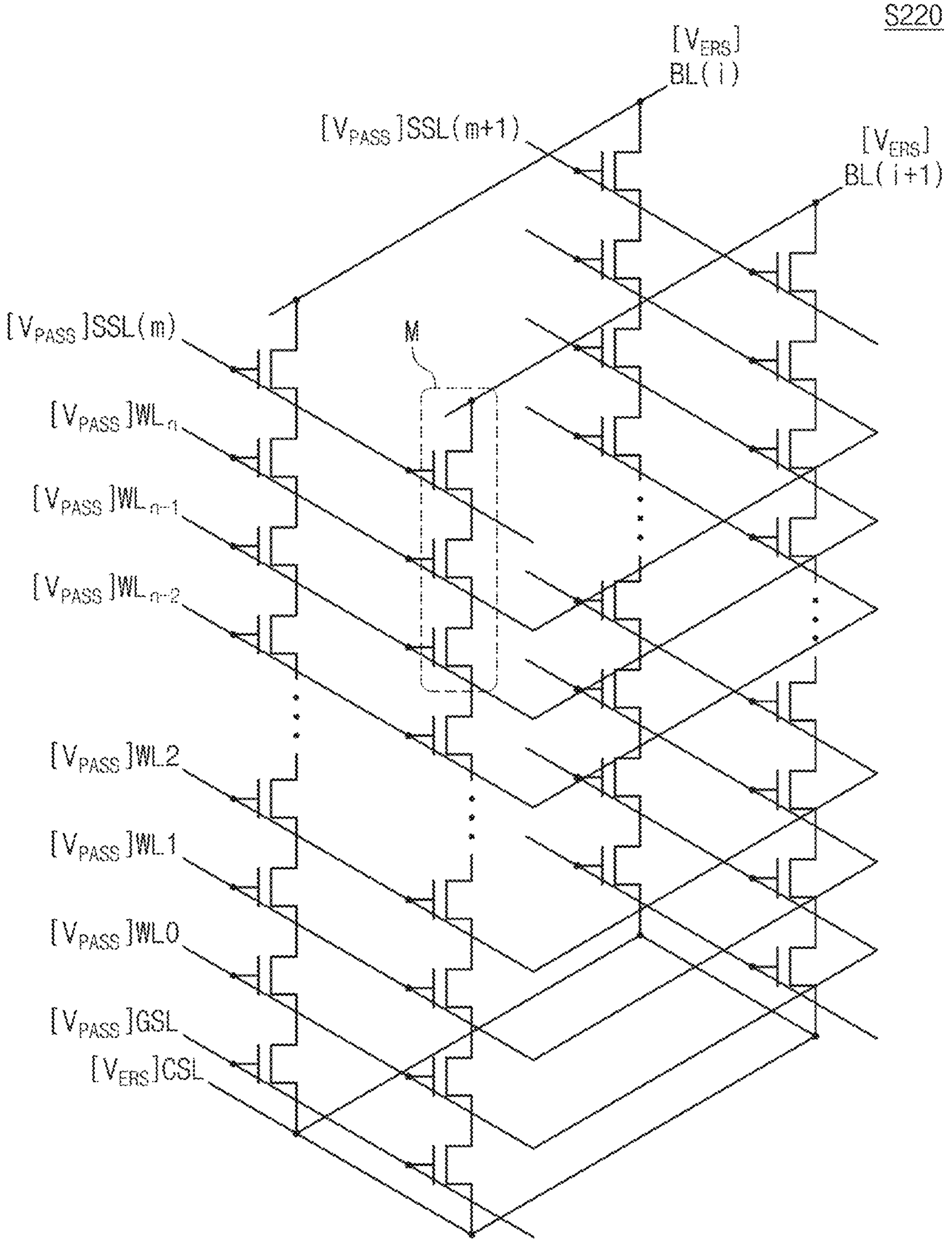
FIG. 16 is a circuit diagram illustrating a voltage condition in step S220 of FIG. 12.
Figure 17:
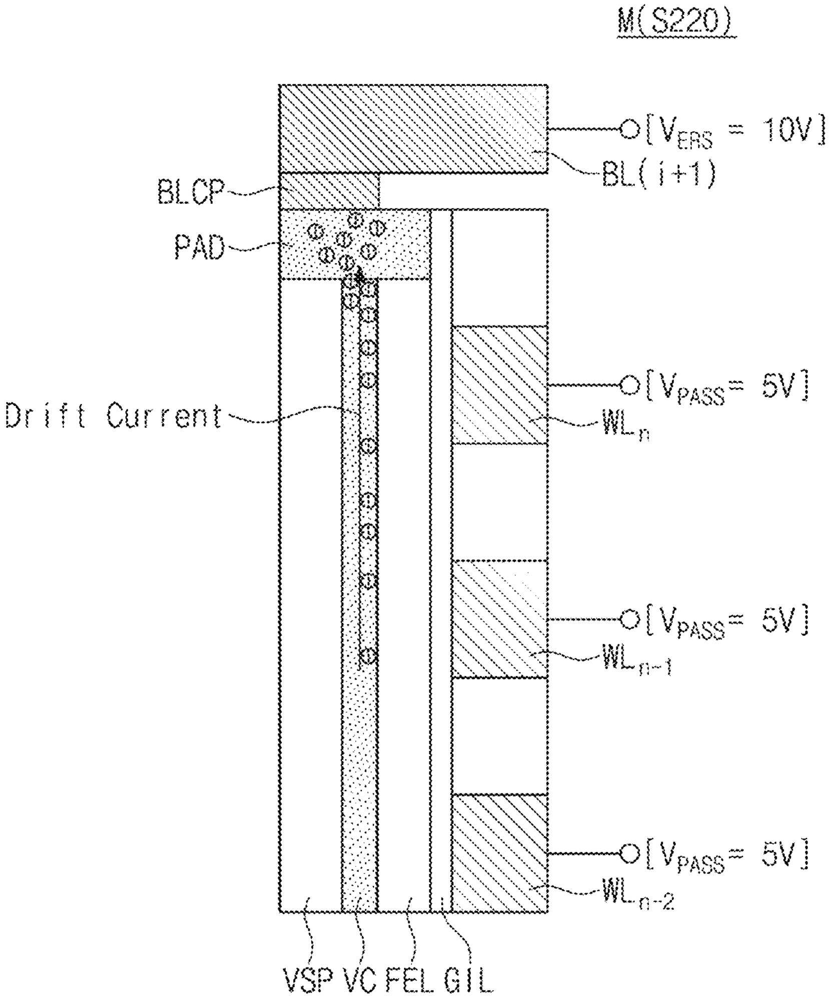
FIGS. 17 and 18 are diagrams sequentially illustrating a portion of a semiconductor memory device corresponding to region "M" of FIG. 14 in step S220.
Figure 18:
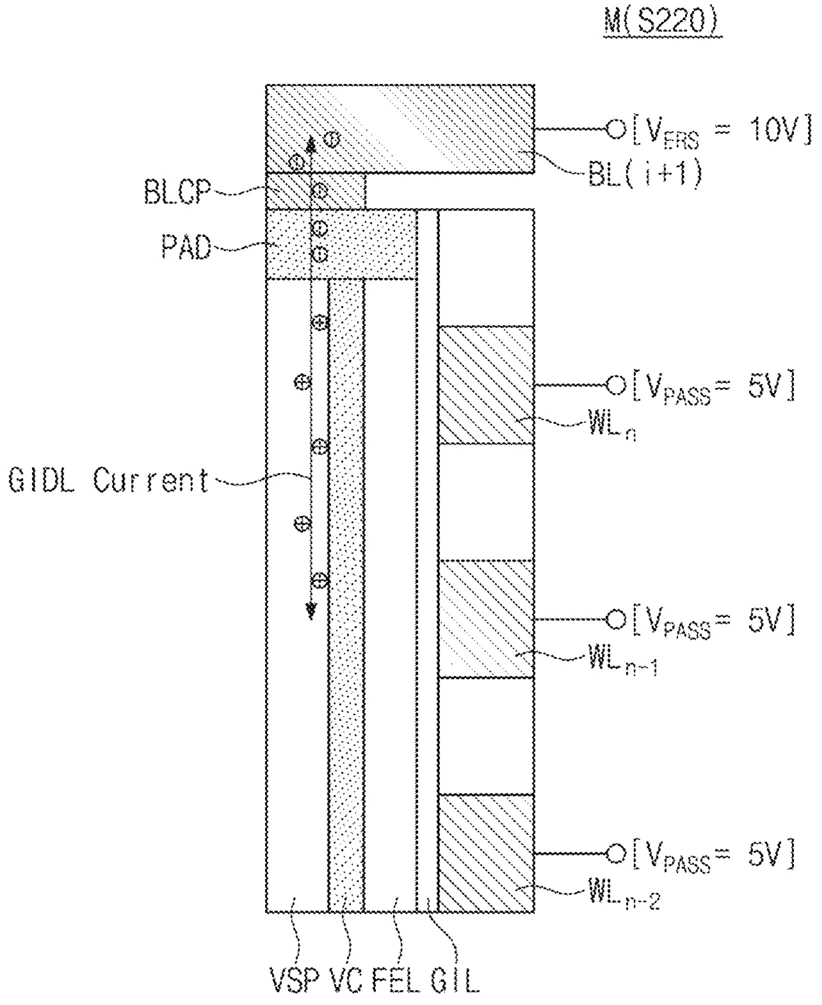

14 is a circuit diagram illustrating a voltage condition in step S210 of FIG. 12. FIG. 15 is a diagram illustrating a portion of a semiconductor memory device corresponding to region "M" of FIG. 14 in step S210. FIG. 16 is a circuit diagram illustrating a voltage condition in step S220 of FIG. 12. FIGS. 17 and 18 are diagrams sequentially illustrating a portion of a semiconductor memory device corresponding to region "M" of FIG. 14 in step S220. Below, the description will be given with reference to FIGS. 1 to 11 together.

Referring to FIGS. 12 and 13, unlike the erase operation of FIG. 8, the erase operation according to an embodiment of the present disclosure may further include a precharge step S210 for precharging the vertical channel layer VC of the semiconductor memory device before the GIDL erase step S220 is performed. When the charge precharge step S210 is performed, the vertical channel layer VC may include electrons precharged at a portion adjacent to the word line WL.

In step S210, the vertical channel layer VC of the semiconductor memory device may be precharged.

Figure 14:
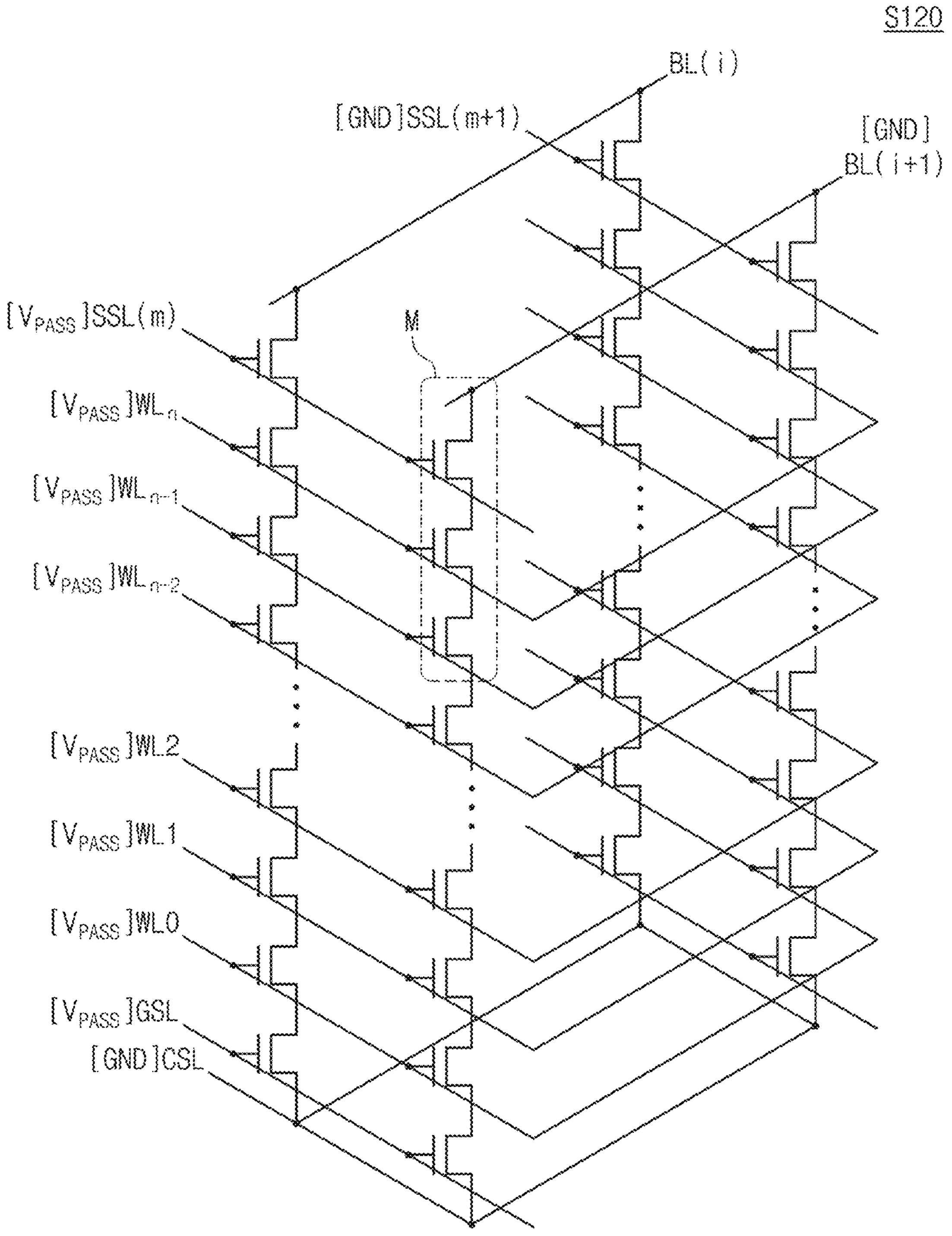
FIG. 14 is a circuit diagram illustrating a voltage condition in step S210 of FIG. 12.
Figure 15:
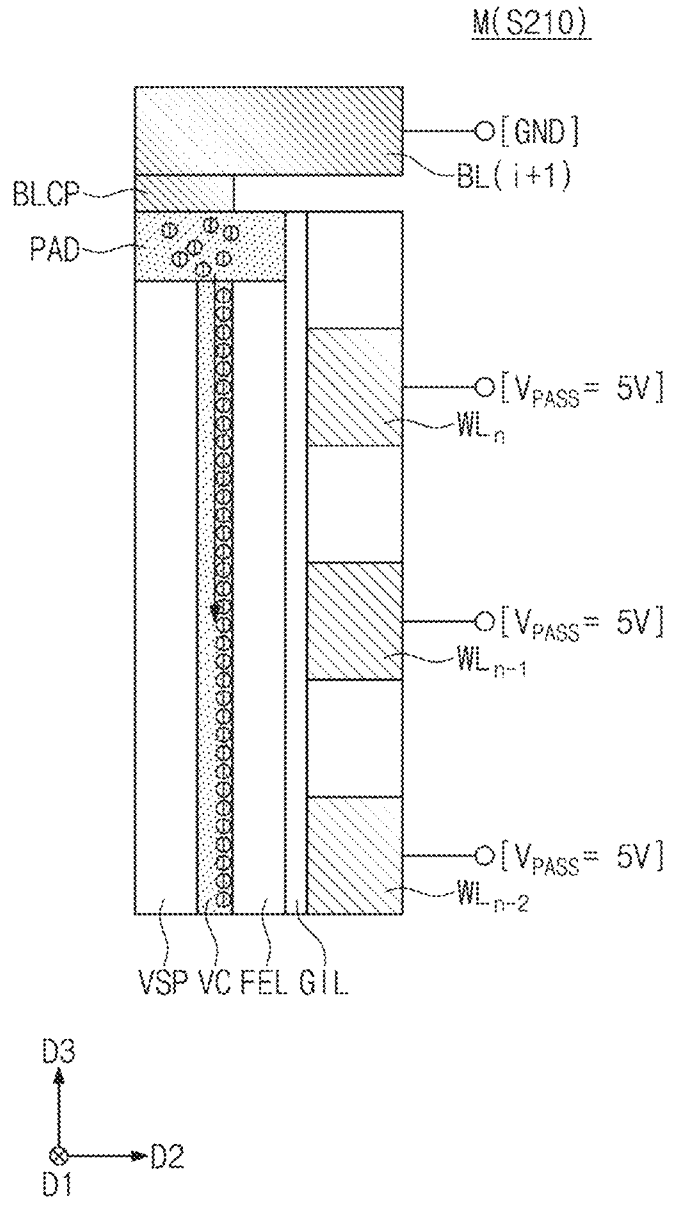
FIG. 15 is a diagram illustrating a portion of a semiconductor memory device corresponding to region "M" of FIG. 14 in step S210.

Referring to FIGS. 14 and 15 together, the charge precharge step S210 may be performed in the time period from t1 to t2. In the charge precharge step, a ground voltage GND may be applied to the bit lines BL(i) and BL(i+1) and the common source line CSL connected with cell strings of each memory block, and the pass voltage $V_{PASS}$ may be applied to the string selection line SSL, the word lines WL, and the ground selection line GSL. The pass voltage $V_{PASS}$ may be greater than the ground voltage GND. For example, the ground voltage GND may be 0 V, and the pass voltage $V_{PASS}$ may be 5 V. However, the present disclosure is not limited thereto. For example, the pass voltage $V_{PASS}$ may be appropriately selected in a range from 0 V to 10 V.

When the pass voltage $V_{PASS}$ applied to the word lines WL is greater than the ground voltage GND applied to the bit line BL, electrons may be introduced into the vertical channel layer VC from the bit line BL through the bit line contact plug BLCP. The electrons introduced into the inside of the vertical channel layer VC may move downwards along the side surface of the vertical channel layer VC adjacent to the word lines WL, that is, may downwards move along a vertical direction (e.g., the third direction D3). In other words, in step S210, the vertical channel layer VC may be precharged with electrons.

Referring to FIGS. 13 and 16 to 18, the GIDL erase step of generating the GIDL current may be performed in the time period from t2 to t3 (S220). In the GIDL erase step, the erase voltage $V_{ERS}$ may be applied to the bit lines BL(i) and BL(i+1) and the common source line CSL connected with cell strings of each memory block, and the pass voltage $V_{PASS}$ may be applied to the string selection line SSL, the word lines WL, and the ground selection line GSL. The erase voltage $V_{ERS}$ may be greater than the pass voltages $V_{PASS}$. For example, the erase voltage $V_{ERS}$ may be 10 V, and the pass voltage $V_{PASS}$ may be 5 V. However, the present disclosure is not limited thereto. For example, the erase voltage $V_{ERS}$ may be appropriately selected in a range from 5 V to 10 V.

When the erase voltage $V_{ERS}$ applied to the bit line BL is greater than the pass voltage $V_{PASS}$ applied to the word lines WL, the electrons in the precharged vertical channel layer VC may be discharged to the bit line BL, and thus, a drift current may be generated (refer to FIG. 17). A build-up potential may be formed due to a sharp voltage change in the vertical channel layer VC according to the drift current.

Afterwards, as described with reference to FIGS. 8 to 10, the hole-electron pairs may be generated by a decrease in the depletion region of the drain on the vertical channel layer VC; as holes and electrons are separated from the hole-electron pairs, the separated holes may be introduced into the vertical semiconductor pattern VSP, and thus, the GIDL current may be generated (refer to FIG. 18). The voltages of the vertical semiconductor pattern VSP and the vertical channel layer VC may gradually increase through the GIDL current.

Figure 19:
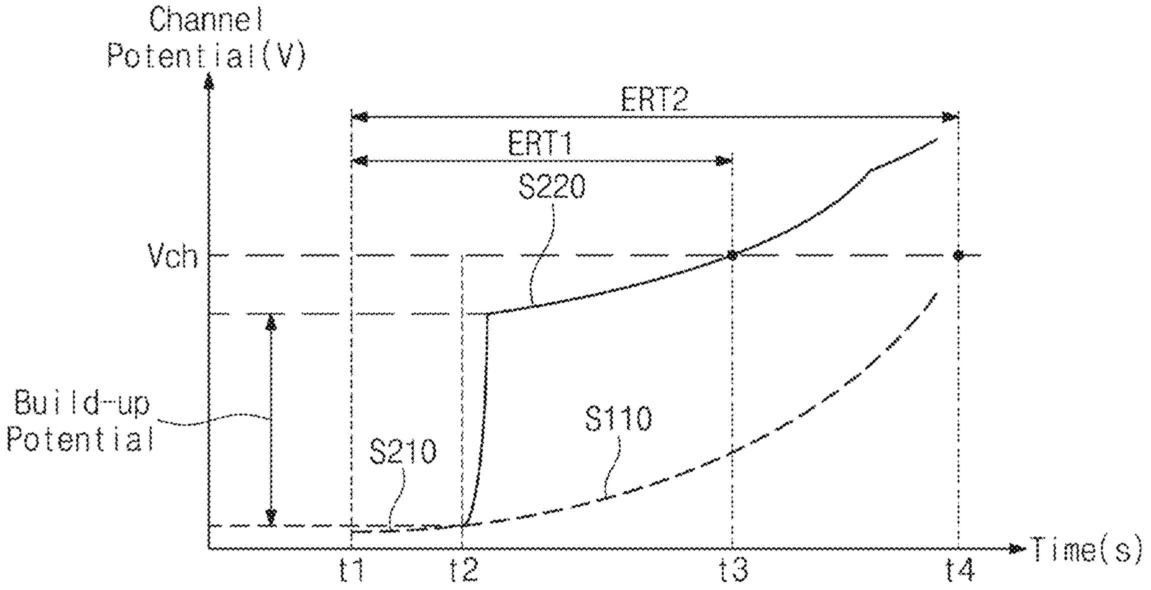
FIG. 19 is a graph illustrating how a voltage of a vertical channel layer increases in an erase operation according to an embodiment of the present disclosure.
Figure 20:
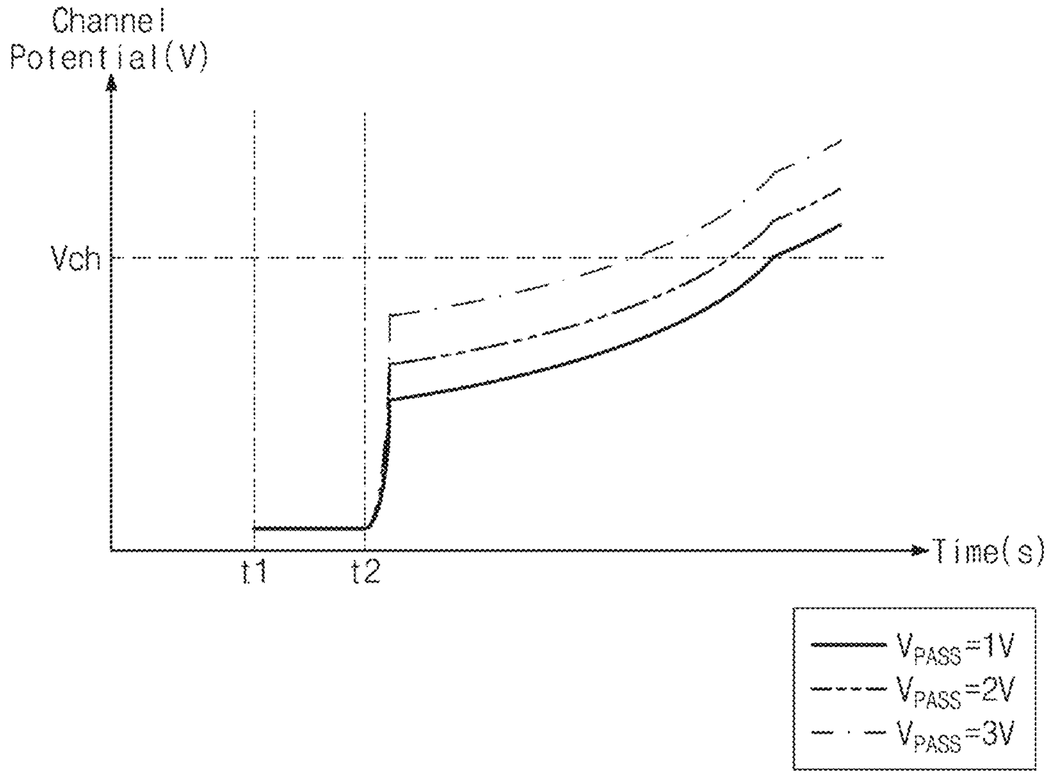
FIG. 20 is a graph illustrating how a voltage of a vertical channel layer changes depending on a magnitude of a pass voltage in an erase operation according to an embodiment of the present disclosure.

FIG. 19 is a graph illustrating how a voltage of a vertical channel layer increases in an erase operation according to an embodiment of the present disclosure. FIG. 20 is a graph illustrating how a voltage of a vertical channel layer changes depending on a magnitude of a pass voltage in an erase operation according to an embodiment of the present disclosure.

Referring to FIG. 13 together, the charge precharge step may be performed in the time period from t1 to t2 (S210), and the GIDL current may be performed at the second point in time t2 (S220).

Referring to FIG. 19, at the second point in time t2, the drift current may be generated as the electrons precharged in the vertical channel layer VC are discharged to the bit line BL. The build-up potential may be formed due to a sharp voltage change in the vertical channel layer VC according to the drift current. Afterwards, as the voltage of the vertical channel layer VC gradually increases through the generation of the GIDL current, at the third point in time t3, the voltage of the vertical channel layer VC may reach the reference voltage Vch. Unlike the above description, in the case where the build-up potential is not formed in the conventional erase operation (e.g., in the case where only operation S110 of FIG. 8 is performed), the voltage of the vertical channel layer VC may reach the reference voltage Vch at the fourth point in time t4.

In an embodiment, as the precharge step S210 is added, a time ERT1 taken for the voltage of the vertical channel layer VC to reach the reference voltage Vch may decrease compared to a time ERT2 taken in the conventional erase operation.

Referring to FIG. 20, it is confirmed that a magnitude of the build-up potential formed at the second point in time t2 increases as the pass voltage $V_{PASS}$ applied to the word lines WL are set to be higher. As such, as the pass voltage $V_{PASS}$ applied to the word lines WL are set to be higher, a time taken for the voltage of the vertical channel layer VC to reach the reference voltage Vch may further decrease.

According to an embodiment of the present disclosure, as the build-up potential is generated in a vertical channel layer during the erase operation, a time taken to perform the erase operation may decrease. Accordingly, compared to the conventional erase operation, the operating speed of the semiconductor memory device according to the present disclosure may be improved.

Figure 21:
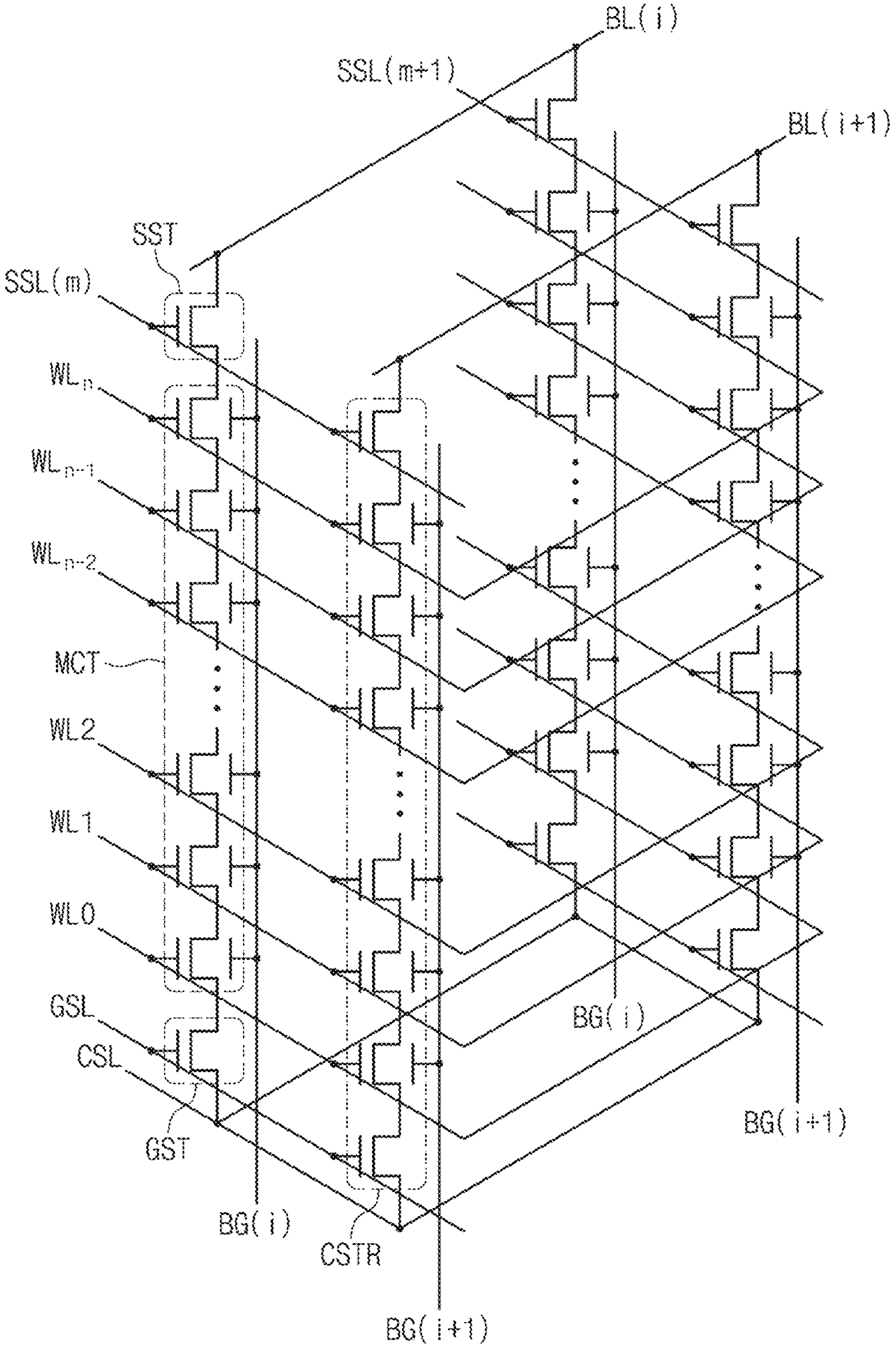
FIG. 21 is a circuit diagram illustrating a cell array of a semiconductor memory device according to embodiments of the present disclosure.

FIG. 21 is a circuit diagram illustrating a cell array of a semiconductor memory device according to embodiments of the present disclosure.

A cell array of a semiconductor memory device according to an embodiment of the present disclosure may include the bit lines BL(i) and BL(i+1), the common source line CSL, the word lines WL0 to WLn, the string selection lines (or upper selection lines) SSL(m) and SSL(m+1), the ground selection lines (or lower selection lines) GSL, and the cell strings CSTR between the bit lines BL(i) and BL(i+1) and the common source line CSL.

In an embodiment, the cell array of the semiconductor memory device may further include back gate lines BGi and BG(i+1). The plurality of back gate lines BGi and BG(i+1)

may be disposed to correspond to the plurality of cell strings CSTR. The semiconductor memory device may control the memory cells MCT through the word lines WL0 to WLn and the back gate lines BGi and BG(i+1).

In the plurality of cell strings CSTR, the memory cells MCT located at the same level may be connected with the same word line WL. According to embodiments, the memory cells MCT of each cell string CSTR may be controlled by the word lines WL0 to WLn and the back gate lines BGi and BG(i+1).

For example, data may be stored in or erased from the memory cells MCT by polarization changes of dipoles in the information storage elements, which are caused by the voltages applied to the word lines WL0 to WLn and the back gate lines BGi and BG(i+1). In an embodiment, the polarization state of the ferroelectric layer FEL of each memory cell MCT may be determined by the voltage difference of the channel region and the back gate line BGi/BG(i+1). The plurality of memory cells MCT may be simultaneously erased by applying the erase voltage $V_{ERS}$ to the back gate lines BGi and BG(i+1).

Figure 22:
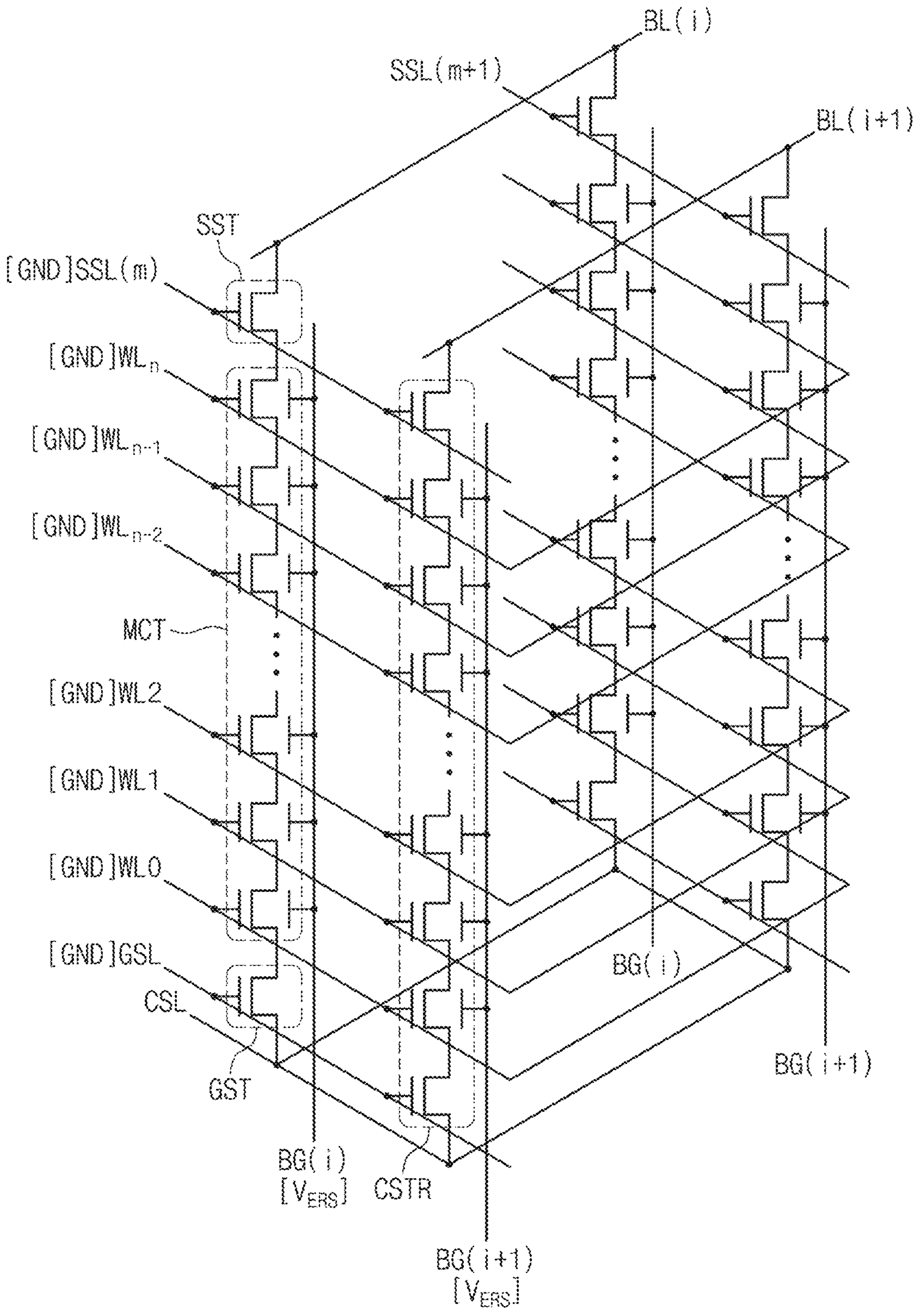
FIG. 22 is a circuit diagram illustrating a voltage condition when an erase operation of a semiconductor memory device of FIG. 21 is performed.

FIG. 22 is a circuit diagram illustrating a voltage condition when an erase operation of a semiconductor memory device of FIG. 21 is performed.

Referring to FIG. 22, when the erase operation of the semiconductor memory device according to the present disclosure is performed, in each memory block, the ground voltage GND may be applied to the string selection lines SSL(m) and SSL(m+1), the word lines WL, and the ground selection line GSL, and the erase voltage $V_{ERS}$ may be applied to the back gate lines BGi and BG(i+1). The erase voltage $V_{ERS}$ may be greater than the ground voltage GND.

Figure 23:
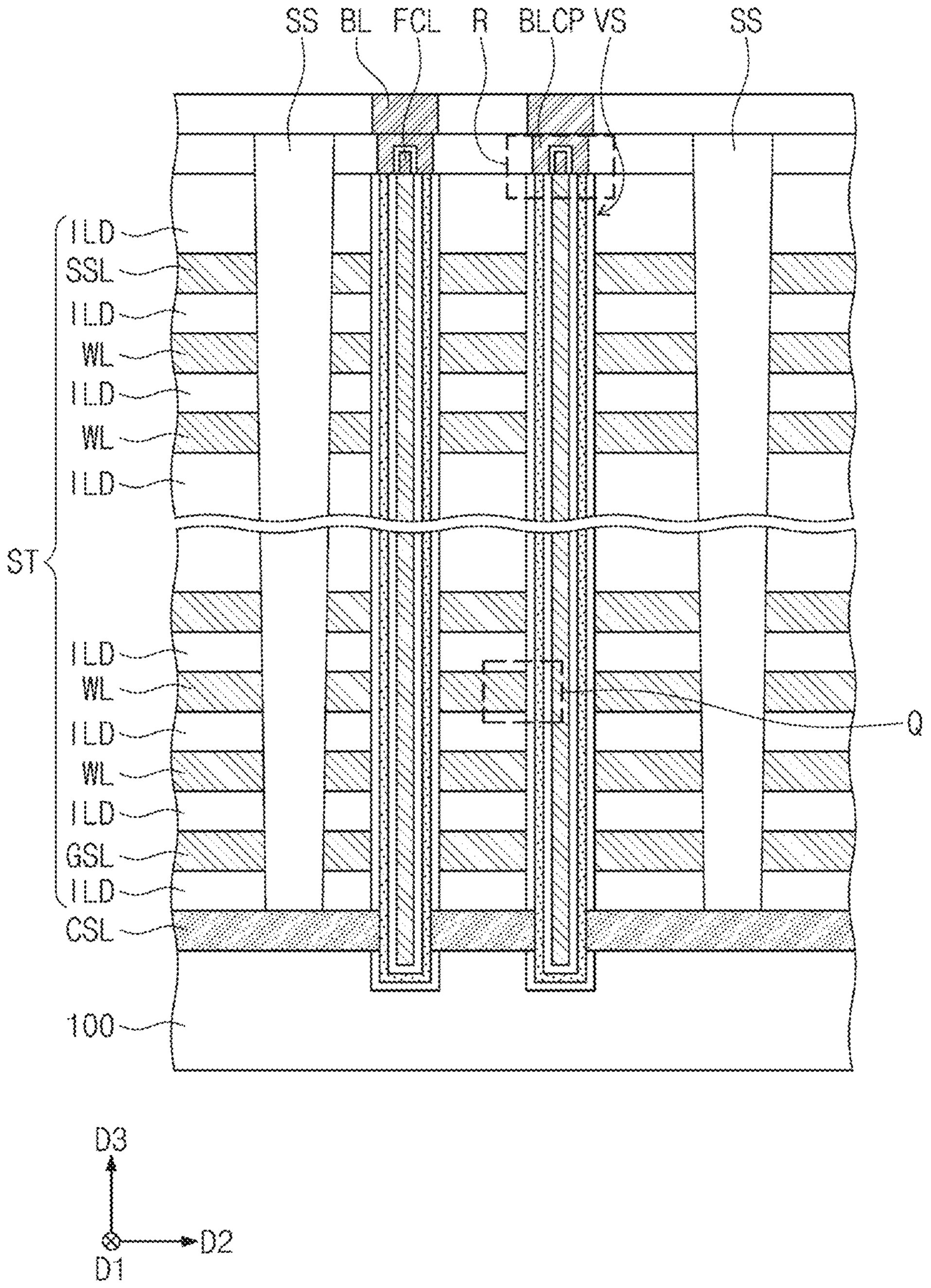
FIG. 23 is a cross-sectional view illustrating an embodiment of a cell array of a semiconductor memory device of FIG. 21.
Figure 24:
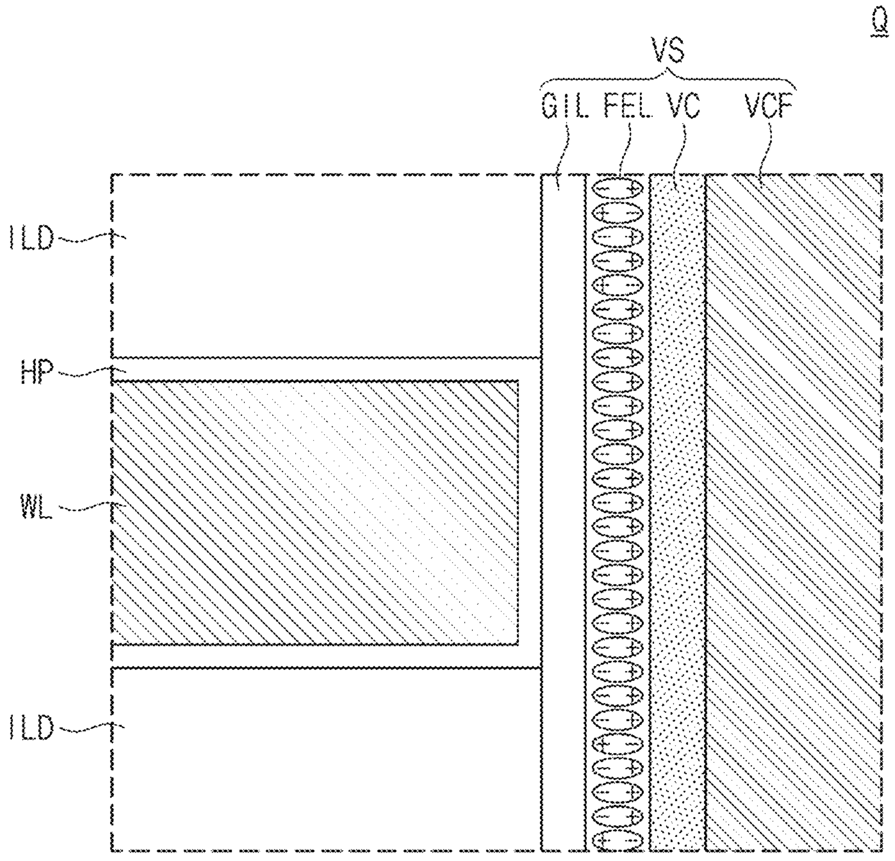
FIGS. 24, 25, and 26 are enlarged views of portion "Q" of FIG. 23.
Figure 25:
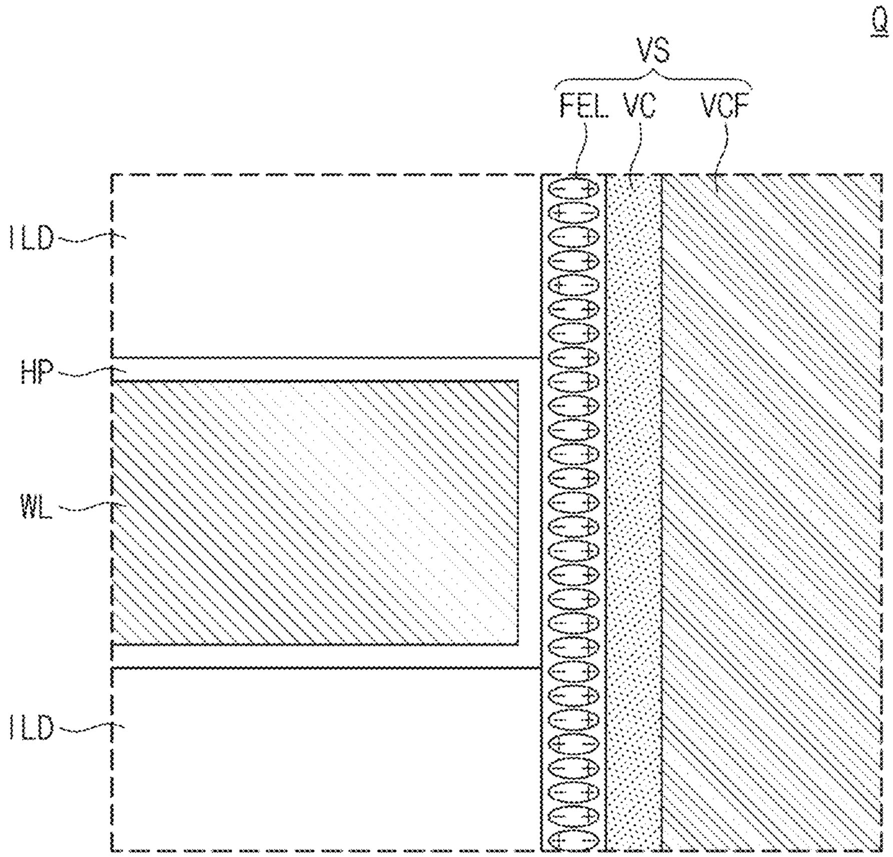
Figure 26:
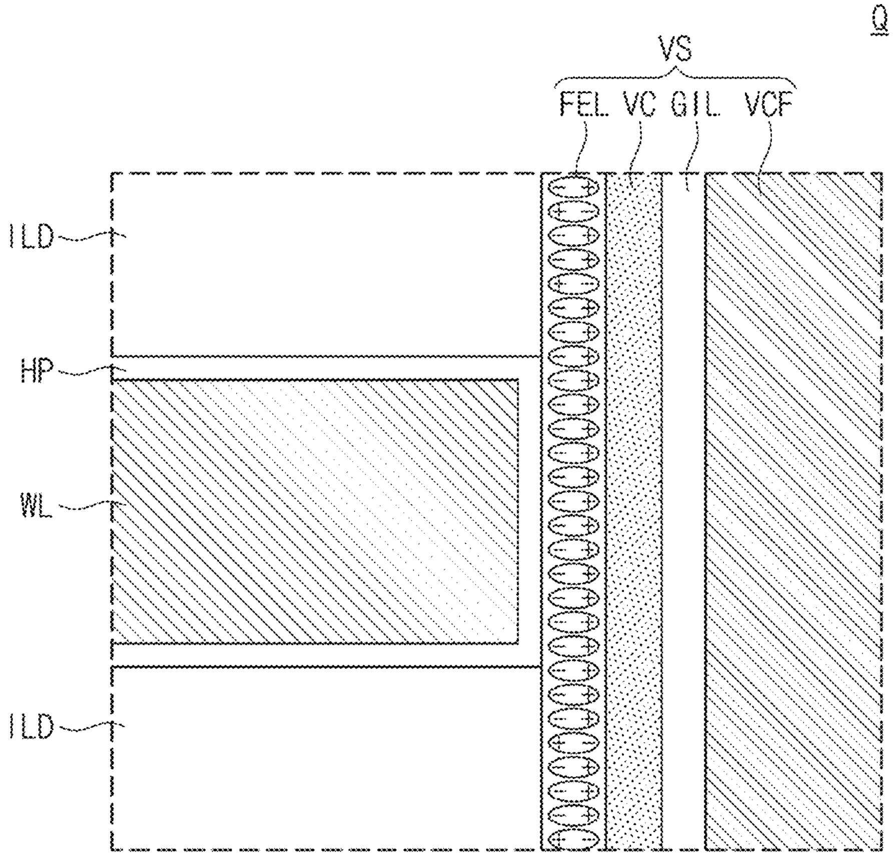
Figure 27:
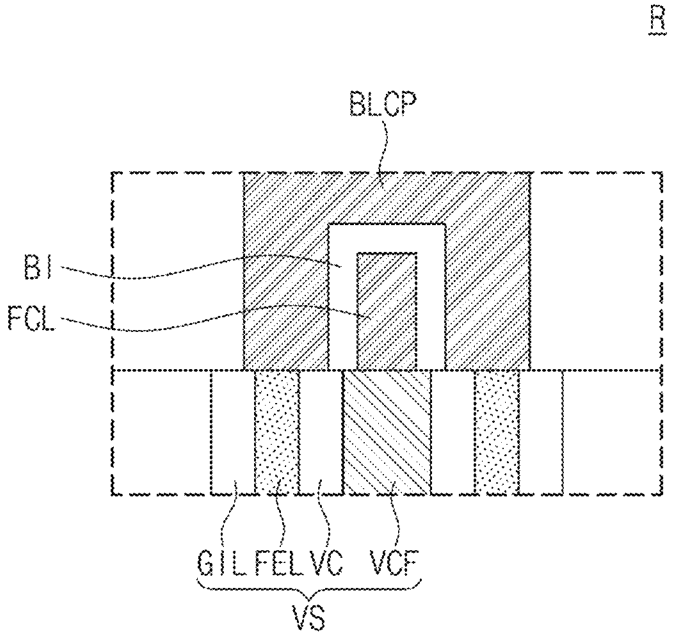
FIG. 27 is an enlarged view of portion "R" of FIG. 23.

FIG. 23 is a cross-sectional view illustrating an embodiment of a cell array of a semiconductor memory device of FIG. 21. FIGS. 24, 25, and 26 are enlarged views of portion “Q” of FIG. 23. FIG. 27 is an enlarged view of portion “R” of FIG. 23. FIGS. 23, 24, 25, and 26 respectively correspond to FIGS. 4, 5, 6, and 7. Below, embodiments of the present disclosure will be described in detail with reference to a difference with the conventional semiconductor memory device described with reference to FIGS. 1 to 7.

Referring to FIG. 23, the semiconductor memory device according to embodiments of the present disclosure may include the stack structure ST, the vertical structures VS, a filler control line FCL, and the bit lines BL on the substrate 100. In an embodiment, the substrate 100, the stack structure ST, and the bit lines BL may be substantially the same as those described in the embodiment of FIG. 3.

Referring to FIG. 24, each of the vertical structures VS may include a vertical conductive filler VCF, the ferroelectric layer FEL between the gate electrode WL and the vertical conductive filler VCF, the gate insulating layer GIL between the ferroelectric layer FEL and the gate electrode WL, and the vertical channel layer VC between the vertical conductive filler VCF and the ferroelectric layer FEL.

In other words, the vertical semiconductor pattern VSP of the conventional semiconductor memory device of FIG. 5 may be replaced with the vertical conductive filler VCF according to an embodiment of the present disclosure. The vertical conductive filler VCF may be used as the back gate line BG(i)/BG(i+1) described with reference to FIG. 21.

The vertical conductive filler VCF may be in the shape of a pillar extending in the third direction D3. Unlike the above example, the vertical conductive filler VCF may have a U-shaped cross section, and the inside of the vertical conductive filler VCF may be filled with an insulating material. The vertical conductive filler VCF may be spaced from the substrate 100, and a portion of the ferroelectric layer FEL may be located between the vertical conductive filler VCF and the substrate 100.

The vertical conductive filler VCF may include, for example, at least one selected from doped semiconductor (e.g., doped silicon), metal (e.g., tungsten, copper, or aluminum), conductive metal nitride (e.g., titanium nitride or tantalum nitride), or transition metal (e.g., titanium or tantalum). For example, the vertical conductive filler VCF may include polysilicon doped with impurities of the second conductivity type (e.g., p-type).

The vertical channel layer VC may surround the sidewall of the vertical conductive filler VCF and may extend in the third direction D3. The vertical channel layer VC may include a semiconductor material such as silicon (Si), germanium (Ge), or a mixture thereof. Also, the vertical channel layer VC may include an IGZO (indium gallium zinc oxide) material. For example, the vertical channel layer VC may include an IGZO semiconductor material.

The ferroelectric layer FEL as a data storage layer may surround the outer wall of the vertical channel layer VC and may extend in the third direction D3. The gate insulating layer GIL may surround the outer wall of the ferroelectric layer FEL and may extend in the third direction D3. The ferroelectric layer FEL and the gate insulating layer GIL may be substantially the same as those described with reference to FIG. 5.

Referring to FIG. 25 showing one embodiment, the gate insulating layer GIL may be omitted from the vertical structure VS, and the horizontal insulating pattern HP may directly contact the ferroelectric layer FEL.

Referring to FIG. 26 showing another embodiment, in the vertical structure VS, the gate insulating layer GIL may be disposed between the vertical conductive filler VCF and the vertical channel layer VC.

Returning to FIG. 23, the bit lines BL may be connected with the vertical channel layers VC of the vertical structures VS through the bit line contact plugs BLCP, and the filler control lines FCL may be connected with the vertical conductive fillers VCF of the vertical structures VS. In an embodiment, the semiconductor memory device may be configured to apply the erase voltage $V_{ERS}$ to the vertical conductive filler VCF through the filler control line FCL.

Referring to FIG. 27, the filler control line FCL may be provided on the upper surface of the vertical structure VS. The filler control line FCL may be connected with the vertical conductive filler VCF of the vertical structure VS. The filler control line FCL may be provided to vertically overlap the vertical conductive filler VCF. For example, the width of the filler control line FCL may be smaller than the width of the vertical conductive filler VCF.

The filler control line FCL may include, for example, at least one selected from doped semiconductor (e.g., doped silicon), metal (e.g., tungsten, copper, or aluminum), conductive metal nitride (e.g., titanium nitride or tantalum nitride), or transition metal (e.g., titanium or tantalum).

The filler control line FCL may be spaced from the bit line BL and may be electrically isolated from the bit line BL. A voltage may be applied to the filler control line FCL, independently of the bit line BL.

For example, the filler control line FCL may be disposed under the lower surface of the bit line BL. However, unlike the example illustrated in drawing, the filler control line FCL may be disposed on the upper surface the bit line BL. An insulating layer BI configured to electrically isolate the filler control line FCL from the bit line BL may surround the upper surface and the side surface of the filler control line FCL.

In the present disclosure, because the ferroelectric layer FEL is used as a data storage layer, there is no need to supply holes to the vertical conductive filler VCF for the purpose of increasing the voltage of the vertical channel layer VC. Accordingly, in an embodiment of the present disclosure, a voltage may be directly applied to the vertical conductive filler VCF through the filler control line FCL, and thus, the erase operating speed may be improved.

Figure 28:
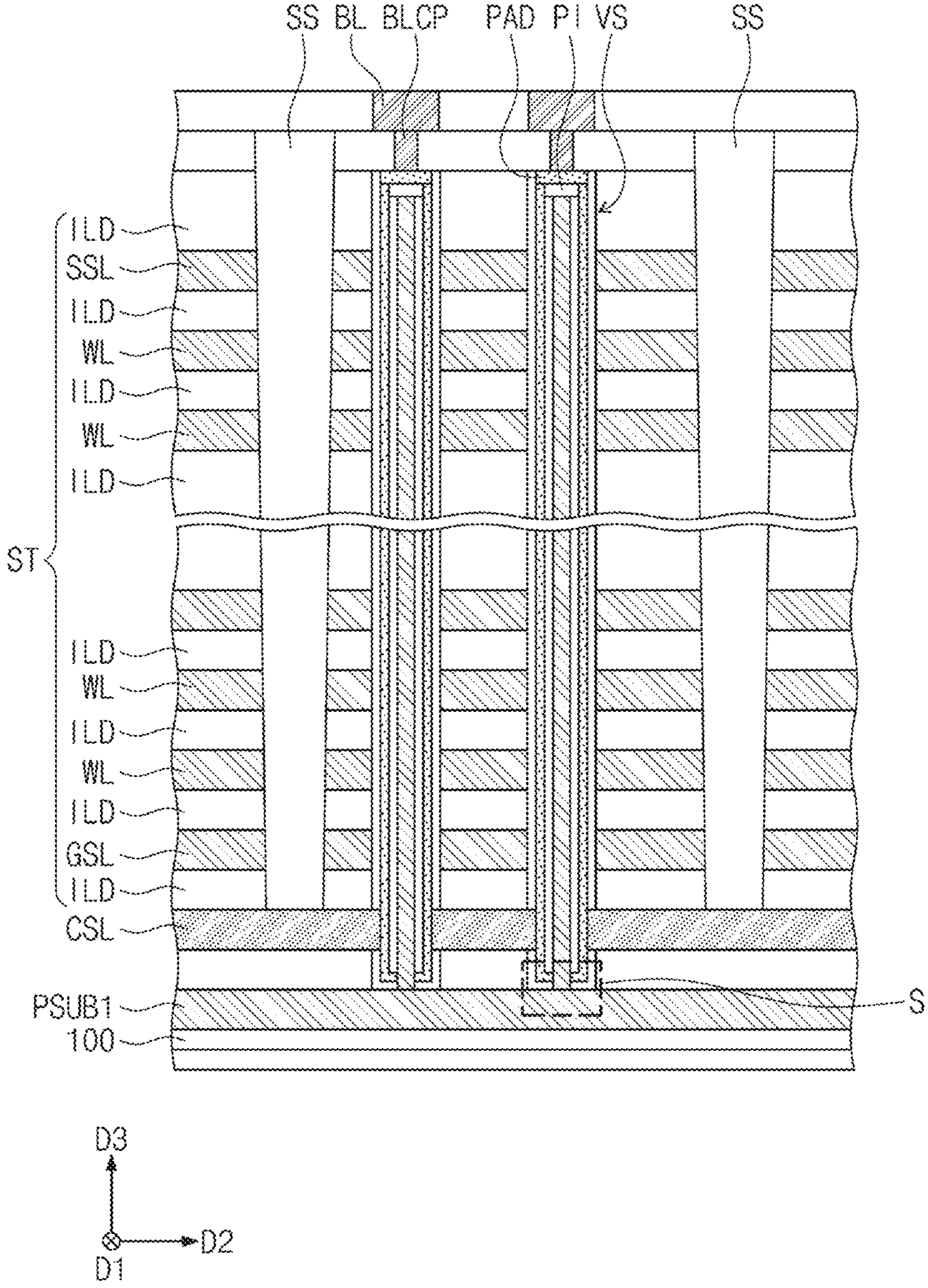
FIG. 28 is a cross-sectional view illustrating an embodiment of a cell array of a semiconductor memory device of FIG. 21.
Figure 29:
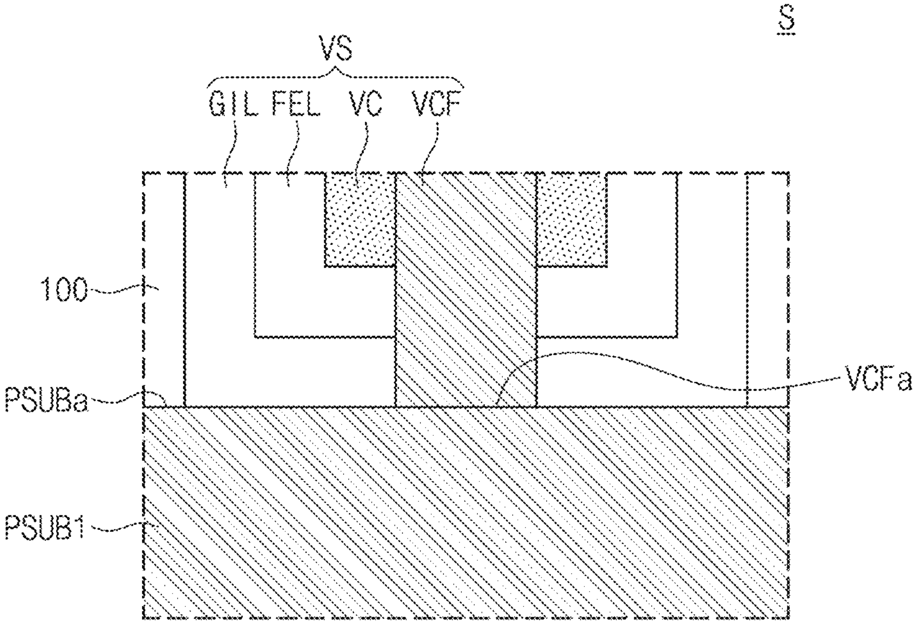
FIG. 29 is an enlarged view of portion "S" of FIG. 28.

FIG. 28 is a cross-sectional view illustrating an embodiment of a cell array of a semiconductor memory device of FIG. 21. FIG. 29 is an enlarged view of portion "S" of FIG. 28. Below, another embodiment of the present disclosure will be described in detail with reference to a difference with the embodiment of the semiconductor memory device described in FIG. 23.

Referring to FIG. 28, the substrate 100 may include a first conductive substrate PSUB1. The first conductive substrate PSUB1 may extend in the second direction D2 within the substrate 100.

The first conductive substrate PSUB1 may include at least one selected from doped semiconductor (e.g., doped silicon), metal (e.g., tungsten, copper, or aluminum), conductive metal nitride (e.g., titanium nitride or tantalum nitride), or transition metal (e.g., titanium or tantalum). For example, the first conductive substrate PSUB1 may include polysilicon doped with impurities of the second conductivity type (e.g., p-type) that is identical to that of the vertical conductive filler VCF.

The vertical structures VS configured to penetrate the stack structure ST and a portion of the substrate 100 may be provided on the upper surface of the first conductive substrate PSUB1. A conductive pad that connects the vertical channel layer VC and the bit line contact plug BLCP may be provided on the vertical structure VS. A pad insulating layer may be provided between the conductive pad and the vertical conductive filler VCF of the vertical structure VS. The conductive pad and the vertical conductive filler VCF may be electrically insulated by the pad insulating layer.

Referring to FIG. 29, the vertical structure VS may include the vertical conductive filler VCF, the vertical channel layer VC, the ferroelectric layer FEL, and the gate insulating layer GIL. The vertical conductive filler VCF may be configured to penetrate the ferroelectric layer FEL and the gate insulating layer GIL up to the lower surface of the vertical structure VS. In other words, a lower surface VCFa of the vertical conductive filler VCF may be substantially coplanar with the lower surface of the vertical structure VS.

The lower surface VCFa of the vertical conductive filler VCF may be directly connected with an upper surface PSUBa of the first conductive substrate PSUB1. In other words, the lower surface VCFa of the vertical conductive filler VCF may be substantially coplanar with the upper surface PSUBa of the first conductive substrate PSUB1.

The first conductive substrate PSUB1 may be connected with the vertical conductive filler VCF. A voltage may be applied to the first conductive substrate PSUB1, independently of the bit line BL. In an embodiment, the semiconductor memory device may be configured to apply the erase voltage $V_{ERS}$ to the vertical conductive filler VCF through the first conductive substrate PSUB1.

Figure 30:
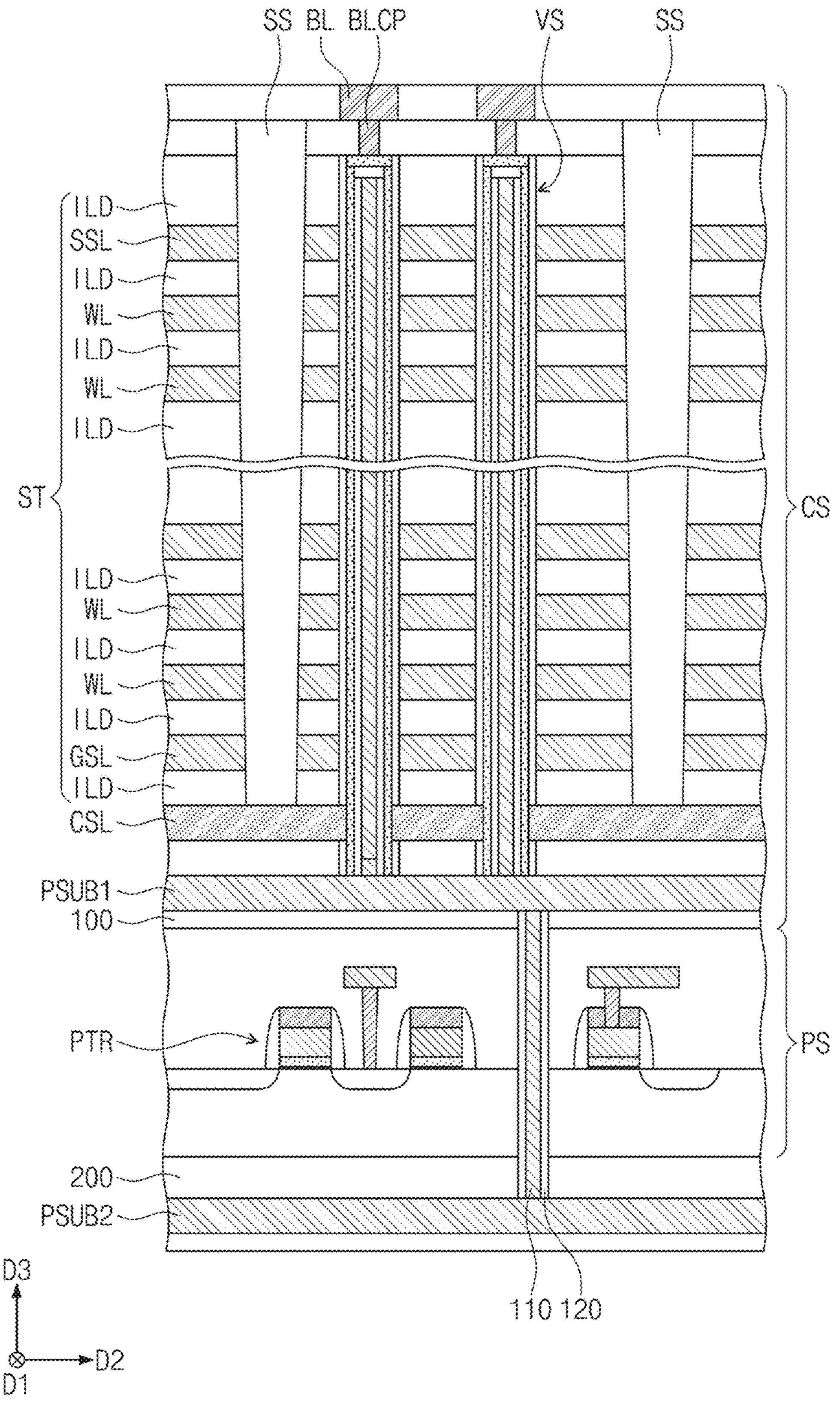
FIG. 30 is a cross-sectional view illustrating an embodiment of a cell array of a semiconductor memory device of FIG. 21.

FIG. 30 is a cross-sectional view illustrating an embodiment of a cell array of a semiconductor memory device of FIG. 21. Below, another embodiment of the present disclosure will be described in detail with reference to a difference with the embodiment of the semiconductor memory device described in FIGS. 28 and 29.

Referring to FIG. 30, a peripheral circuit structure PS including peripheral transistors PTR may be disposed on a lower substrate 200. The peripheral circuit structure PS may include the plurality of peripheral transistors PTR disposed on the lower substrate 200. The peripheral transistors PTR may constitute row and column decoders, a page buffer, a control circuit, a peripheral logic circuit, etc. for controlling the semiconductor memory device. The peripheral circuit structure PS may include a peripheral circuit including a decoder circuit, a page buffer, and a logic circuit.

A cell array structure CS including the stack structure ST may be disposed on the peripheral circuit structure PS. The cell array structure CS may be substantially identical to that of the embodiment of the semiconductor memory device described with reference to FIGS. 28 and 29. In an embodiment, a semiconductor memory device may be provided in a cell on peri (COP) form where a cell array structure is provided on a peripheral circuit structure.

The lower substrate 200 may be a silicon substrate, a silicon-germanium substrate, a germanium substrate, or a single crystalline epitaxial layer grown on a single crystalline silicon substrate. Also, the lower substrate 200 may include the same materials as the substrate 100.

The lower substrate 200 may include a second conductive substrate PSUB2. The second conductive substrate PSUB2 may extend in the second direction D2 within the lower substrate 200.

Like the first conductive substrate PSUB1, the second conductive substrate PSUB2 may include at least one selected from doped semiconductor (e.g., doped silicon), metal (e.g., tungsten, copper, or aluminum), conductive metal nitride (e.g., titanium nitride or tantalum nitride), or transition metal (e.g., titanium or tantalum). For example, the second conductive substrate PSUB2 may include polysilicon doped with impurities of the second conductivity type (e.g., p-type) that is identical to that the vertical conductive filler VCF.

In an embodiment, a conductive via 110 and a via insulator 120 may be provided between the lower substrate 200 and the substrate 100. The conductive via 110 may extend in the third direction D3 to penetrate the peripheral circuit structure PS. The via insulator 120 may be provided between the conductive via 110 and the peripheral circuit structure PS. The conductive via 110 may be electrically insulated from the peripheral circuit structure PS by the via insulator 120.

The conductive via 110 may electrically connect the first conductive substrate PSUB1 and the second conductive substrate PSUB2. Like the first conductive substrate PSUB1 and the second conductive substrate PSUB2, the conductive via 110 may include at least one selected from doped semiconductor (e.g., doped silicon), metal (e.g., tungsten, copper, or aluminum), conductive metal nitride (e.g., titanium nitride or tantalum nitride), or transition metal (e.g., titanium or tantalum). For example, the conductive via 110 may include polysilicon doped with impurities of the second conductivity type (e.g., p-type) that is identical to that of the vertical conductive filler VCF.

A voltage may be applied to the second conductive substrate PSUB2, independently of the bit line BL. In an embodiment, the semiconductor memory device may be configured to apply the erase voltage $V_{ERS}$ to the vertical conductive filler VCF through the second conductive substrate PSUB2.

Figure 31:
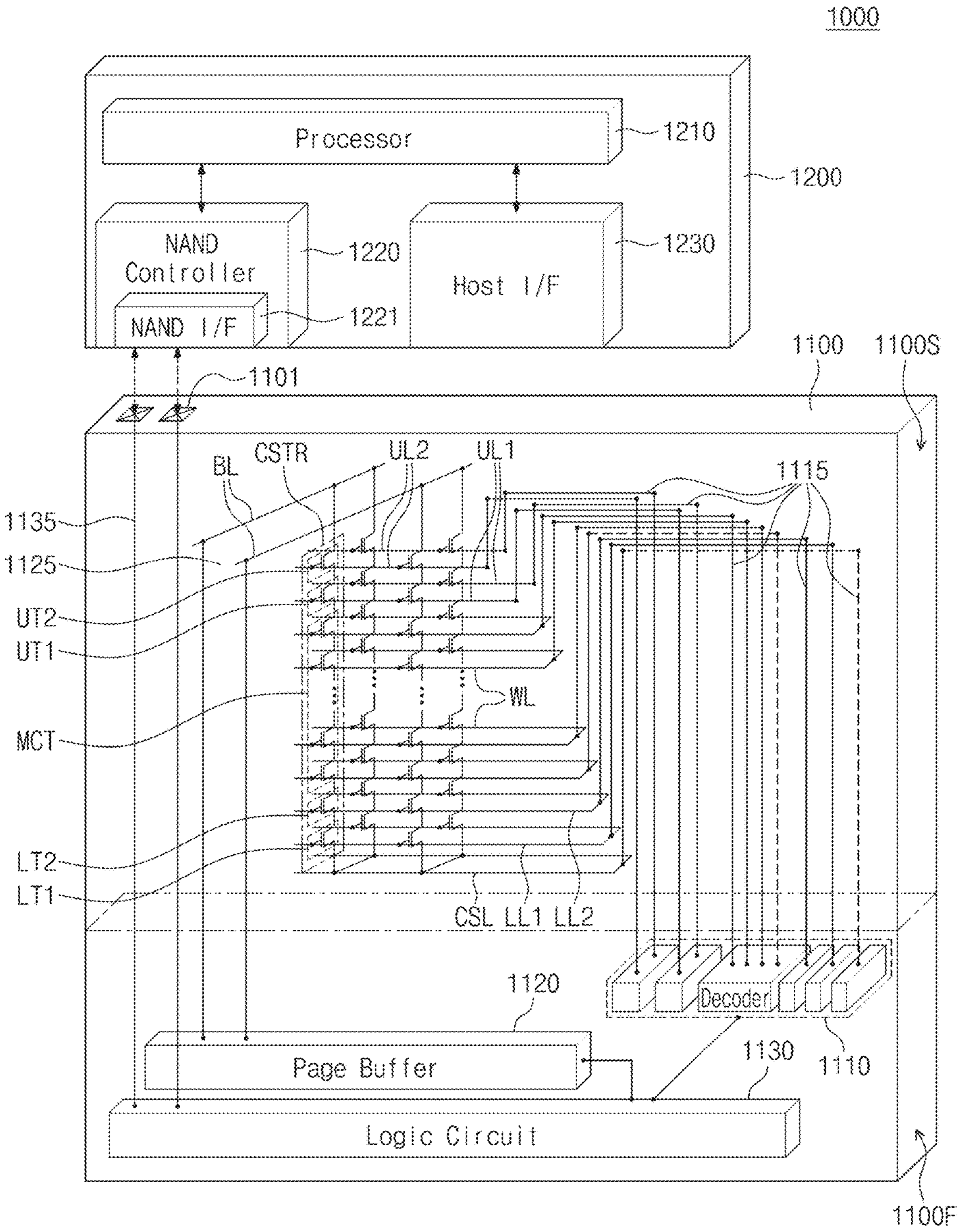
FIG. 31 is a diagram illustrating an electronic system including a semiconductor device according to embodiments of the present disclosure.

FIG. 31 is a diagram illustrating an electronic system including a semiconductor device according to embodiments of the present disclosure.

Referring to FIG. 31, an electronic system 1000 according to an embodiment of the present disclosure may include a semiconductor device 1100 and a controller 1200 electrically connected with the semiconductor device 1100. The electronic system 1000 may be a storage device that includes one or plural semiconductor devices 1100 or an electronic device that includes the storage device. For example, the electronic system 1000 may be a device, which includes one or plural semiconductor devices 1100, such as a solid state drive (SSD) device, a universal serial bus (USB) device, a computing system, a medical device, or a communication device.

The semiconductor device 1100 may be a nonvolatile memory device, for example, a NAND flash memory device. The semiconductor device 1100 may include a first structure 1100F and a second structure 1100S on the first structure 1100F. In an embodiment, the first structure 1100F may be disposed next to the second structure 1100S. The first structure 1100F may be a peripheral circuit structure including a decoder circuit 1110, a page buffer 1120, and a logic circuit 1130. The second structure 1100S may be a memory cell (MCT) structure including the bit lines BL, the word lines WL, first and second upper gate lines UL1 and UL2, first and second lower gate lines LL1 and LL2, and memory cell strings CSTR between the bit lines BL and the common source line CSL.

In the second structure 1100S, each of the memory cell strings CSTR may include lower transistors LT1 and LT2 adjacent to the common source line CSL, upper transistors UT1 and UT2 adjacent to the bit lines BL, and a plurality of memory cell transistors MCT disposed between the lower transistors LT1 and LT2 and the upper transistors UT1 and UT2. The number of lower transistors LT1 and LT2 and the number of upper transistors UT1 and UT2 may be variously changed or modified depending on embodiments.

In an embodiment, the lower transistors LT1 and LT2 may include a ground selection transistor, and the upper transistors UT1 and UT2 may include a string selection transistor. The lower gate lines LL1 and LL2 may be gate electrodes of the lower transistors LT1 and LT2. The word lines WL may be gate electrodes of the memory cell transistors MCT, and the upper gate lines UL1 and UL2 may be gate electrodes of the upper transistors UT1 and UT2.

In an embodiment, the lower transistors LT1 and LT2 may include the lower erase control transistor LT1 and the ground selection transistor LT2 connected in series. The upper transistors UT1 and UT2 may include the string selection transistor UT1 and the upper erase control transistor UT2. At least one of the lower erase control transistor LT1 and the upper erase control transistor UT2 may be used for the erase operation of erasing data stored in the memory cell transistors MCT by using the gate induced drain leakage (GIDL).

The common source line CSL, the first and second lower gate lines LL1 and LL2, the word lines WL, and the first and second upper gate lines UL1 and UL2 may be electrically connected with the decoder circuit 1110 through first connection wires 1115 that extend to the second structure 1100S within the first structure 1100F. The bit lines BL may be electrically connected with the page buffer 1120 through second connection wires 1125 that extend to the second structure 1100S within the first structure 1100F.

In the first structure 1100F, the decoder circuit 1110 and the page buffer 1120 may perform a control operation for at least one selection memory cell transistor among the plurality of memory cell transistors MCT. The decoder circuit 1110 and the page buffer 1120 may be controlled by the logic circuit 1130. The semiconductor device 1100 may communicate with the controller 1200 through an input/output pad 1101 electrically connected with the logic circuit 1130. The input/output pad 1101 may be electrically connected with the logic circuit 1130 through an input/output connection wire 1135 that extend to the second structure 1100S within the first structure 1100F.

The controller 1200 may include a processor 1210, a NAND controller 1220, and a host interface 1230. According to embodiments, the electronic system 1000 may include the plurality of semiconductor devices 1100; in this case, the controller 1200 may control the plurality of semiconductor devices 1100.

The processor 1210 may control an overall operation of the electronic system 1000 including the controller 1200. The processor 1210 may operate based on given firmware and may control the NAND controller 1220 to access the semiconductor device 1100. The NAND controller 1220 may include a NAND interface 1221 that processes the communication with the semiconductor device 1100. A control command for controlling the semiconductor device 1100, data to be recorded at the memory cell transistors MCT of the semiconductor device 1100, data read from the memory cell transistors MCT of the semiconductor device 1100, etc. may be transmitted through the NAND interface 1221. The host interface 1230 may provide a communication function between the electronic system 1000 and an external host. When a control command is received from the external host through the host interface 1230, the processor 1210 may control the semiconductor device 1100 in response to the control command.

Figure 32:
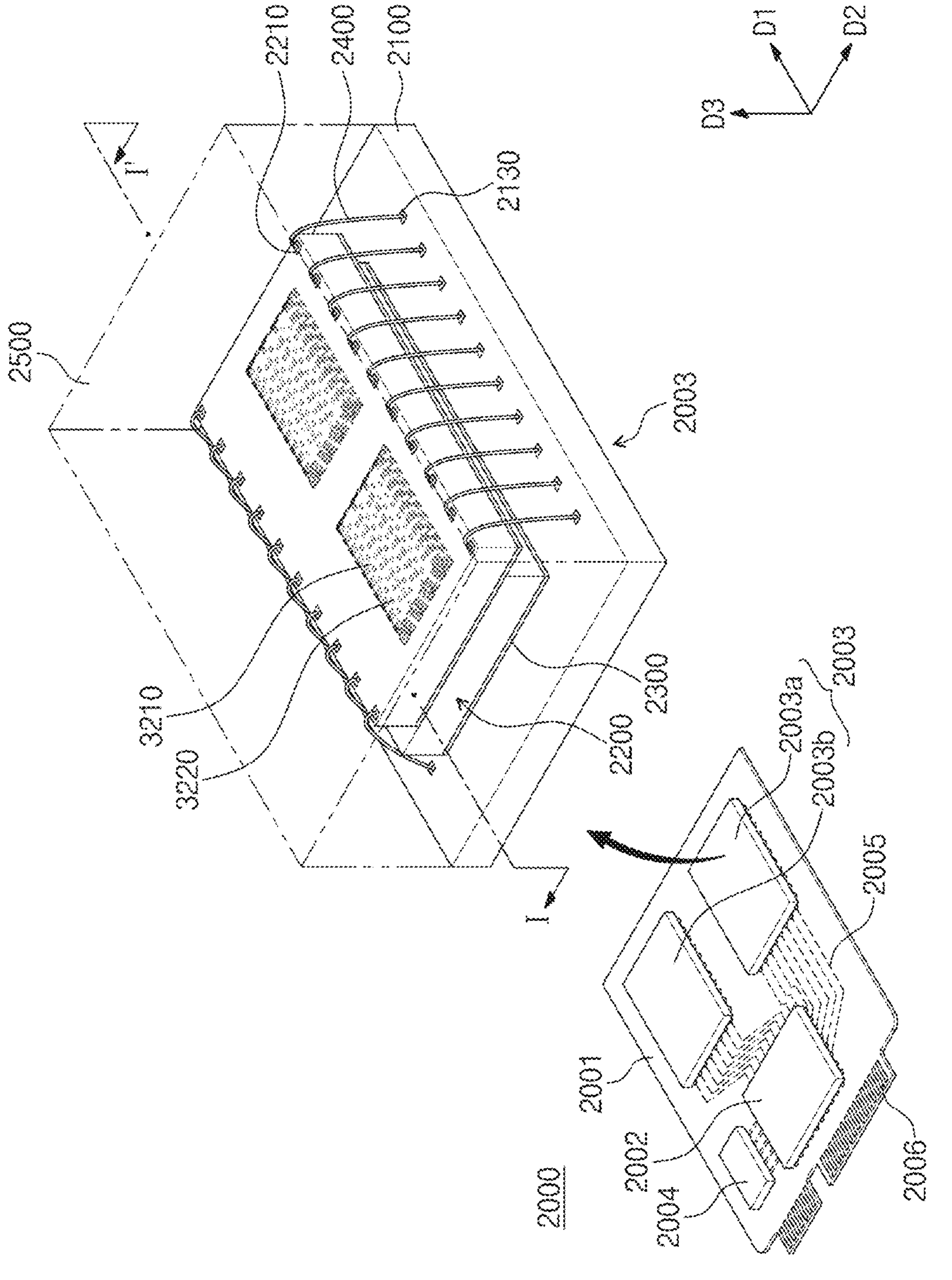
FIG. 32 is a perspective view illustrating an electronic system including a semiconductor device according to embodiments of the present disclosure.

FIG. 32 is a perspective view illustrating an electronic system including a semiconductor device according to embodiments of the present disclosure.

Referring to FIG. 32, an electronic system 2000 according to an embodiment of the present disclosure may include a main board 2001, and a controller 2002, one or more semiconductor packages 2003, and a DRAM 2004 that are mounted on the main board 2001. The semiconductor packages 2003 and the DRAM 2004 may be connected with the controller 2002 by wire patterns 2005 formed in the main board 2001.

The main board 2001 may include a connector 2006 including a plurality of pins that are connected with the external host. The number and arrangement of pins on the connector 2006 may change depending on a communication interface between the electronic system 2000 and the external host. In an embodiment, the electronic system 2000 may communicate with the external host through any one of interfaces such as USB (Universal Serial Bus), PCI-Express (Peripheral Component Interconnect Express), SATA (Serial Advanced Technology Attachment), and UFS (Universal Flash Storage). In an embodiment, the electronic system 2000 may operate based on a power supplied from the external host through the connector 2006. The electronic system 2000 may further include a power management integrated circuit (PMIC) that distributes the power from the external host into the controller 2002 and the semiconductor packages 2003.

The controller 2002 may record data at the semiconductor packages 2003 or may read data from the semiconductor packages 2003, and thus, the operation speed of the electronic system 2000 may be improved.

The DRAM 2004 may be a buffer memory for alleviating the speed difference of the semiconductor packages 2003 being a data storage space and the external host. The DRAM 2004 included in the electronic system 2000 may operate as a kind of cache memory, and may provide a space for temporarily storing data in the control operation for the semiconductor packages 2003. In the case where the DRAM 2004 is included in the electronic system 2000, the controller 2002 may further include a DRAM controller for controlling the DRAM 2004, in addition to a NAND controller for controlling the semiconductor packages 2003.

The semiconductor packages 2003 may include first and second semiconductor packages 2003*a* and 2003*b* spaced from each other. Each of the first and second semiconductor packages 2003*a* and 2003*b* may be a semiconductor package including a plurality of semiconductor chips 2200. Each of the first and second semiconductor packages 2003*a* and 2003*b* may include a package board 2100, the semiconductor chips 2200 on the package board 2100, adhesive layers 2300 disposed on the lower surface of each of the semiconductor chips 2200, a connection structure 2400 electrically connecting the semiconductor chips 2200 and the package board 2100, and a molding layer 2500 covering the semiconductor chips 2200 and the connection structure 2400 on the package board 2100.

The package board 2100 may be a printed circuit board including package upper pads 2130. Each of the semiconductor chips 2200 may include an input/output pad 2210. The input/output pad 2210 may correspond to the input/output pad 1101 of FIG. 31. Each of the semiconductor chips 2200 may include stack structures 3210 and vertical structures 3220. Each of the semiconductor chips 2200 may include a semiconductor device according to embodiments of the present disclosure, which will be described below.

In an embodiment, the connection structure 2400 may be a bonding wire electrically connecting the input/output pad 2210 and a package upper pad 2130. Accordingly, in each of the first and second semiconductor packages 2003*a* and 2003*b*, the semiconductor chips 2200 may be electrically connected with each other by the bonding wire method and may be electrically connected with the package upper pads 2130 of the package board 2100. According to embodiments, in each of the first and second semiconductor packages 2003*a* and 2003*b*, the semiconductor chips 2200 may be connected with each other by a connection structure including a through silicon via (TSV) instead of the connection structure 2400 of the bonding wire method.

In an embodiment, the controller 2002 and the semiconductor chips 2200 may be included in one package. In an embodiment, the controller 2002 and the semiconductor chips 2200 may be mounted on a separate interposer board 100 different from the main board 2001, and the controller 2002 and the semiconductor chips 2200 may be connected with each other by wires formed in the interposer board 100.

Figure 33:
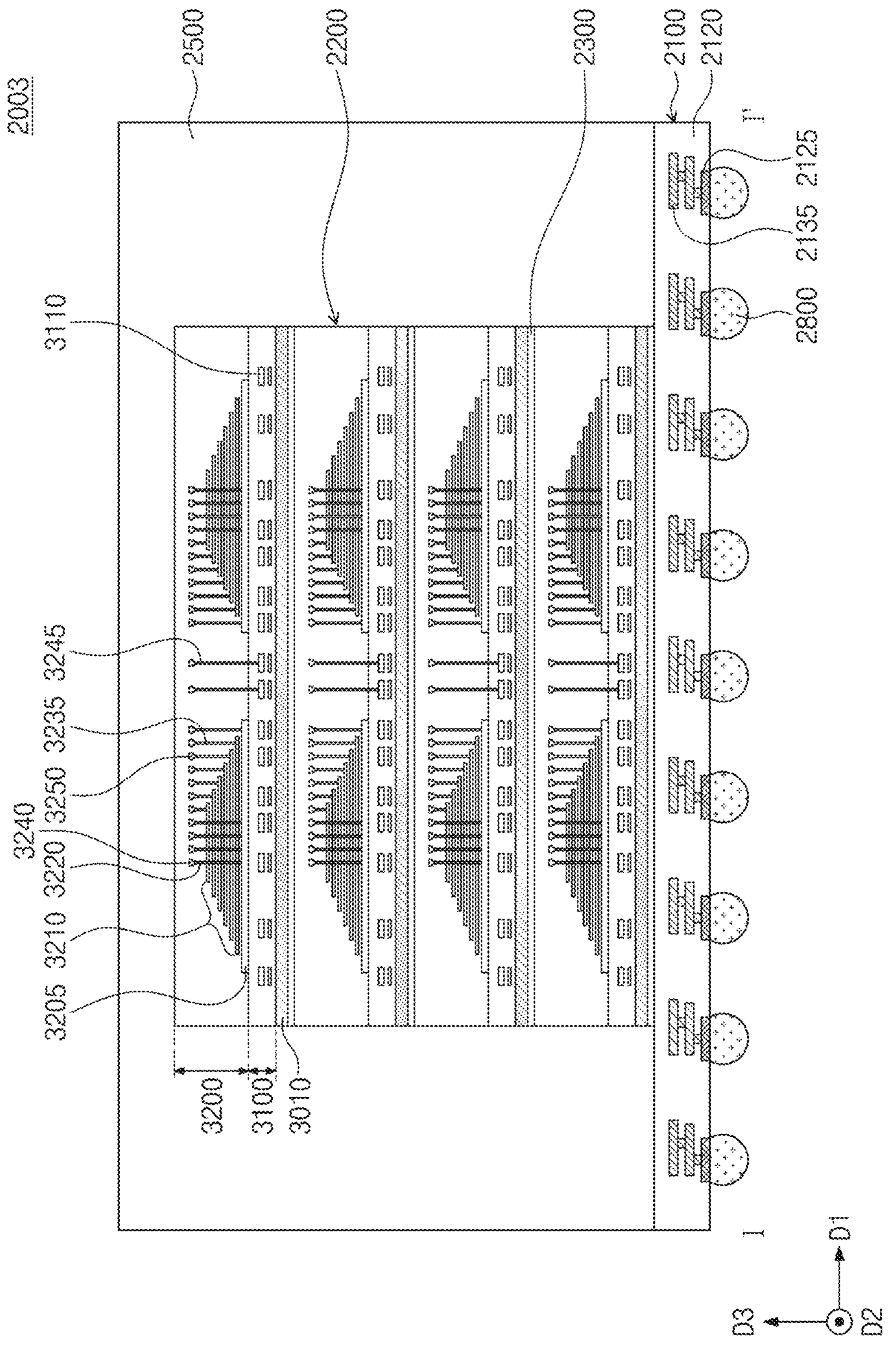
FIGS. 33 and 34 are cross-sectional views illustrating semiconductor packages according to an embodiment of the present disclosure.
Figure 34:
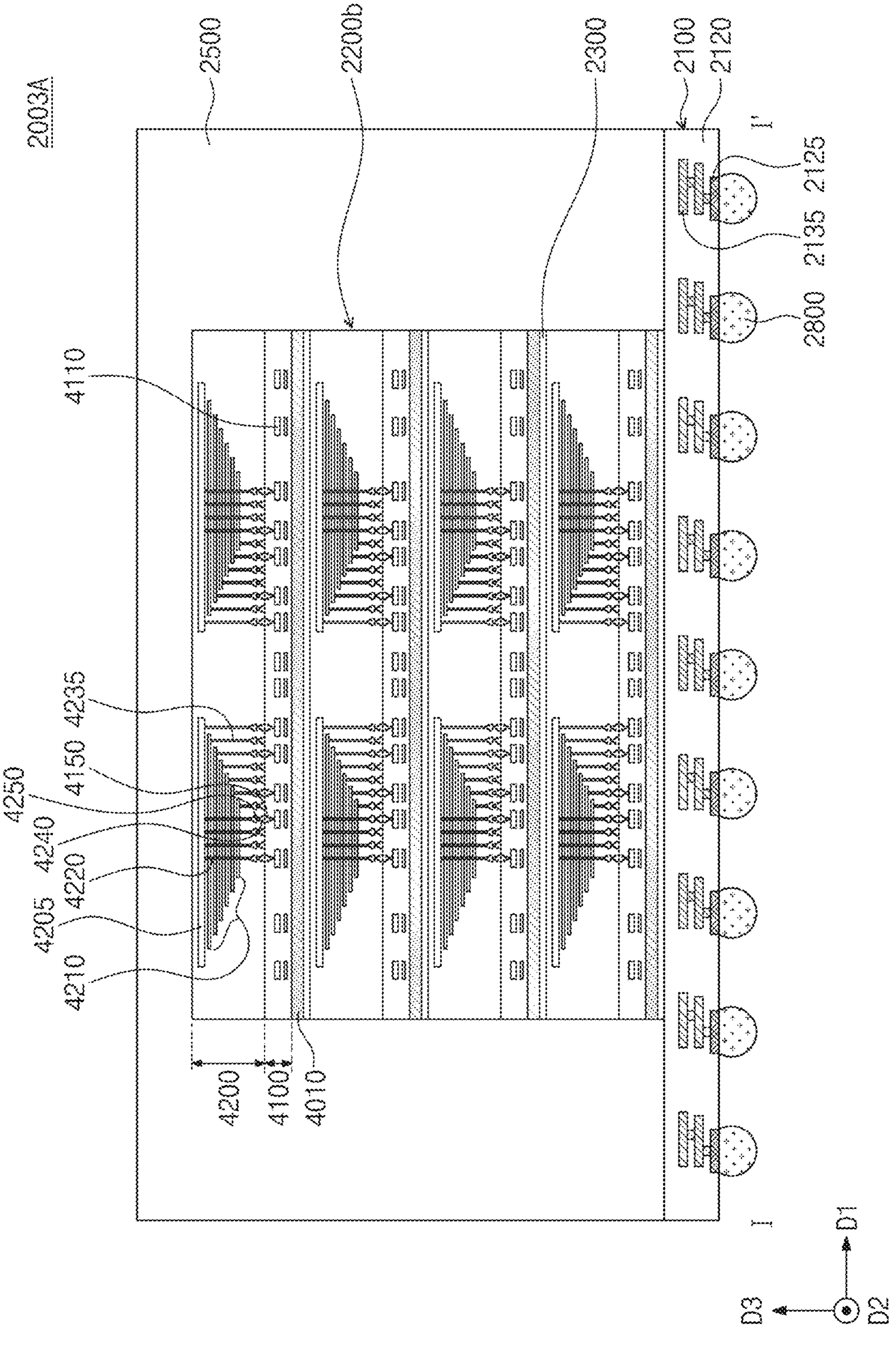

FIGS. 33 and 34 are cross-sectional views illustrating semiconductor packages according to an embodiment of the present disclosure. FIGS. 33 and 34 describe the embodiment of the semiconductor package of FIG. 32 and show a region of the semiconductor package taken along line I-I' of FIG. 32.

Referring to FIG. 33, in the semiconductor packages 2003, the package board 2100 may be the printed circuit board 100. The package board 2100 may include a body portion 2120, the package upper pads 2130 (refer to FIG. 32) disposed on the upper surface of the body portion 2120, lower pads 2125 disposed on the lower surface of the body portion 2120 or exposed through the lower surface of the body portion 2120, and internal wires 2135 electrically connecting the upper pads 2130 and lower pads 2125 within the body portion 2120. The upper pads 2130 may be electrically connected with connection structures 2400. The lower pads 2125 may be connected with the wire patterns 2005 of the main board 2001 of the electronic system 2000 through conductive connection parts 2800.

Each of the semiconductor chips 2200 may include a semiconductor substrate 3010, and a first structure 3100 and a second structure 3200 sequentially stacked on the semiconductor substrate 3010. The first structure 3100 may include a peripheral circuit region including peripheral wires 3110. The second structure 3200 may include a source structure 3205, a stack structure 3210 on the source structure 3205, vertical structures 3220 and separation structures penetrating the stack structure 3210, bit lines 3240 electrically connected with the vertical structures 3220, and cell contact plugs 3235 electrically connected with word lines WL (refer to FIG. 31) of the stack structure 3210.

Each of the semiconductor chips 2200 may include through-hole wires 3245 that are electrically connected with the peripheral wires 3110 of the first structure 3100 and extend to pass through the second structure 3200. The through-hole wires 3245 may be disposed on the outside of the stack structures 3210 and may be further disposed to penetrate the stack structure 3210. Each of the semiconductor chips 2200 may further include the input/output pads 2210 (refer to FIG. 32) that are electrically connected with the peripheral wires 3110 of the first structure 3100.

Referring to FIG. 34, in a semiconductor package 2003A, each of semiconductor chips 2200*b* may include a semiconductor substrate 4010, a first structure 4100 on the semiconductor substrate 4010, and a second structure 4200 bonded to the first structure 4100 in a wafer bonding method on the first structure 4100.

The first structure 4100 may include a peripheral circuit region including a peripheral wire 4110 and first bonding structures 4150. The second structure 4200 may include a source structure 4205, a stack structure 4210 between the source structure 4205 and the first structure 4100, vertical structures 4220 and separation structures penetrating the stack structure 4210, and second bonding structures 4250 electrically connected with the vertical structures 4220 and word lines WL (refer to FIG. 31) of the stack structure 4210. For example, the second bonding structures 4250 may be electrically connected with the vertical structures 4220 and the word lines WL (refer to FIG. 31) through bit lines 4240 electrically connected with the vertical structures 4220 and cell contact plugs 4235 electrically connected with the word lines WL. The first bonding structures 4150 of the first structure 4100 and the second bonding structures 4250 of the second structure 4200 may be bonded and may contact each other. Portions where the first bonding structures 4150 and the second bonding structures 4250 are bonded may be formed of copper (Cu), for example.

Each of the semiconductor chips 2200*a* may further include the input/output pads 2210 (refer to FIG. 32) that are electrically connected with the peripheral wires 4110 of the first structure 4100.

The semiconductor chips 2200 of FIG. 33 and the semiconductor chips 2200*a* of FIG. 34 may be electrically connected with each other by the connection structures 2400 of the bonding wire shape. However, in some embodiments, semiconductor chips, which are included in one semiconductor package, such as the semiconductor chips 2200 of FIG. 33 and the semiconductor chips 2200*a* of FIG. 34 may be electrically connected with each other by a connection structure including through silicon vias (TSV).

The first structure 3100 of FIG. 33 and the first structure 4100 of FIG. 34 may correspond to the peripheral circuit structure PS according to the embodiment of FIG. 30, and the second structure 3200 of FIG. 33 and the second structure 4200 of FIG. 34 may correspond to the cell array structure according to the embodiment of FIG. 30.

An embodiment of the present disclosure provides an erase operation method of a low-power, high-speed semiconductor memory device.

An embodiment of the present disclosure provides a low-power, high-speed semiconductor memory device.

An embodiment of the present disclosure provides an electronic system including a low-power, high-speed semiconductor memory device.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. An erase operation method of a semiconductor memory device which includes a cell string disposed between a bit line and a common source line and connected with a plurality of word lines, the method comprising:

precharging a channel of the cell string by applying a ground voltage to the bit line and applying a pass voltage to the word lines; and generating a gate inducted drain leakage (GIDL) current by applying an erase voltage to the bit line and the pass voltage to the word lines, wherein the pass voltage is greater than the ground voltage, and the erase voltage is greater than the pass voltage.

2. The method of claim 1, wherein the cell string includes:

a ground selection transistor connected with the common source line;

a string selection transistor connected with the bit line; and memory cells connected with the word lines, wherein the memory cells are disposed between the ground selection transistor and the string selection transistor.

3. The method of claim 2, wherein each of the memory cells includes a ferroelectric layer as a data storage layer.

4. The method of claim 3, wherein the ferroelectric layer includes a ferroelectric material having a polarization characteristic by an electric field applied to the ferroelectric layer.

5. The method of claim 3, wherein the ferroelectric layer includes at least one of HfO2, HfSiO2 (Si-doped HfO2), HfAlO2 (Al-doped HfO2), HfSiON, HfZnO, HfZrO2, ZrO2, ZrSiO2, HfZrSiO2, ZrSiON, LaAlO, HfDyO2, and HfScO2.

6. The method of claim 3, wherein the pass voltage ranges from 0 V to 10 V.

7. The method of claim 2, wherein the cell string further includes:

a vertical semiconductor pattern;

a vertical channel layer surrounding the vertical semiconductor pattern; and a ferroelectric layer surrounding the vertical channel layer, wherein the vertical semiconductor pattern includes one of a semiconductor material doped with impurities, an intrinsic semiconductor material not doped with impurities, and a polycrystalline semiconductor material.

8. The method of claim 7, wherein the bit line is connected with the vertical channel layer, wherein the precharging of the channel of the cell string includes:

precharging the vertical channel layer with electrons.

9. The method of claim 8, wherein the generating of the GIDL current includes:

generating the GIDL current after forming a build-up potential in the vertical channel layer, such that a voltage of the vertical semiconductor pattern increases.

* * * * *